(12) United States Patent
Shiraishi

(10) Patent No.: US 12,532,735 B2
(45) Date of Patent: Jan. 20, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nobuhito Shiraishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 631 days.

(21) Appl. No.: 17/900,252

(22) Filed: Aug. 31, 2022

(65) Prior Publication Data

US 2023/0112824 A1 Apr. 13, 2023

(30) Foreign Application Priority Data

Oct. 13, 2021 (JP) .................................. 2021-167860

(51) Int. Cl.
*H01L 23/522* (2006.01)
*H01L 21/768* (2006.01)
*H10D 1/47* (2025.01)

(52) U.S. Cl.
CPC ........ *H01L 23/5228* (2013.01); *H01L 21/768* (2013.01); *H10D 1/47* (2025.01)

(58) Field of Classification Search
CPC .. H10D 1/40; H10D 1/43; H10D 1/47; H10D 1/472; H10D 1/474; H10D 1/476; H01C 7/006; H01L 23/5228; H01L 21/768; H01L 23/5283

See application file for complete search history.

(56) References Cited

U.S. PATENT DOCUMENTS

| 8,659,122 | B2 * | 2/2014 | Matsumura | ........... | H01L 23/522 |
| | | | | | 257/E29.325 |
| 10,014,363 | B2 | 7/2018 | Ema et al. | | |
| 2004/0227237 | A1 | 11/2004 | Ueda | | |
| 2023/0068846 | A1 * | 3/2023 | Horng | ..................... | H01L 24/45 |

FOREIGN PATENT DOCUMENTS

| JP | 09-311432 A | 12/1997 |
| JP | 2004-281966 A | 10/2004 |
| JP | 2017-147380 A | 8/2017 |

OTHER PUBLICATIONS

Office Action dated Jan. 28, 2025, from corresponding Japanese Patent Application No. 2021-167860, 8 pages.

* cited by examiner

*Primary Examiner* — Aaron J Gray
(74) *Attorney, Agent, or Firm* — Rimon. P.C

(57) ABSTRACT

A semiconductor device includes resistor layers, and a wiring layer which is disposed at least either above or below the resistor layers. The resistor layers include first resistor layers and second resistor layers each having a width in a first direction smaller than a width of the first resistor layer in a first direction. The wiring layer includes first overlapping regions in which the wiring layer overlaps with the first resistor layers in plan view and second overlapping regions in which the wiring layer overlaps with the second resistor layers in plan view. A value obtained by dividing a total value of areas of the second overlapping regions by a width of the second resistor layer is smaller than a value obtained by dividing a total value of areas of the first overlapping regions by a width of the first resistor layer.

8 Claims, 25 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2021-167860 filed on Oct. 13, 2021 including the specification, drawings and abstract is incorporated herein by reference in its entirety.

BACKGROUND

This disclosure relates to a semiconductor device and a method of manufacturing the same.

In a semiconductor device including a plurality of resistor elements, in a case in which a region in which patterns such as wires are densely formed and a region in which the patterns are sparsely formed are present, a width of the wire in the region in which the patterns are sparsely formed is smaller than a width of the wire in the region in which the patterns are densely formed. This has been known as a micro-loading effect. The micro-loading effect causes variations in resistance values of resistor elements.

There are disclosed techniques listed below.
  [Patent Document 1] Japanese Unexamined Patent Application Publication. No. H09-311432

Patent Document 1 discloses a semiconductor device in which a dummy pattern having a pattern width substantially same as that of a real pattern is formed in an outer peripheral portion not formed with a pattern (real pattern) constituting a circuit is formed. In the semiconductor device, as compared with a semiconductor device not formed with a dummy pattern, a difference due to the pattern density is reduced.

SUMMARY

In a semiconductor device including an analog circuit that is highly precise, further reduction in variations of resistance values of a plurality of resistor elements included in the highly precise analog circuit has been required. For example, a semiconductor device including a digital-to-analog converter (DAC), variations have been required to he smaller than 0.2% a center value of the resistance values of the plurality of resistor elements.

The present inventors have confirmed that, in the semiconductor device disclosed in Patent Document 1, if the outer peripheral portion in which the dummy pattern is formed and which is not used for a circuit is not wide enough, variations of the resistance values of plurality of resistor elements in the real pattern become larger than 0.2% of the center value of each resistance value.

Other problems and novel features will be apparent from the description of this specification and accompanying drawings.

A semiconductor device according to this disclosure includes an interlayer insulation layer, a plurality of resistor layers which are each disposed in contact with an upper surface of the interlayer insulation layer, and a wiring layer which is disposed at least either above or below the plurality of resistor layers so as to overlap with the plurality of resistor layers in plan view. The plurality of resistor layers include first resistor layers and the second resistor layers each having a width in a first direction smaller than a width of each of the first resistor layers in the first direction. The wiring layer includes first overlapping regions in which the wiring layer overlaps with the first resistor layers in plan view and the second overlapping regions in which the wiring layer overlaps with the second resistor layers in plan view. A value obtained by dividing a total value of areas of the second overlapping regions by a width of each of the second resistor layers in the first direct direction is smaller than a value obtained by dividing a total value areas of the first overlapping regions by a width of each of the first resistor layer in the first direction.

According to the present disclosure, it is possible to provide a semiconductor device in which variations of resistance values of a plurality of resistor elements are reduced, achieving reduction of an outer peripheral portion which is not used for a circuit.

DETAILED DESCRIPTION

Figure 1:
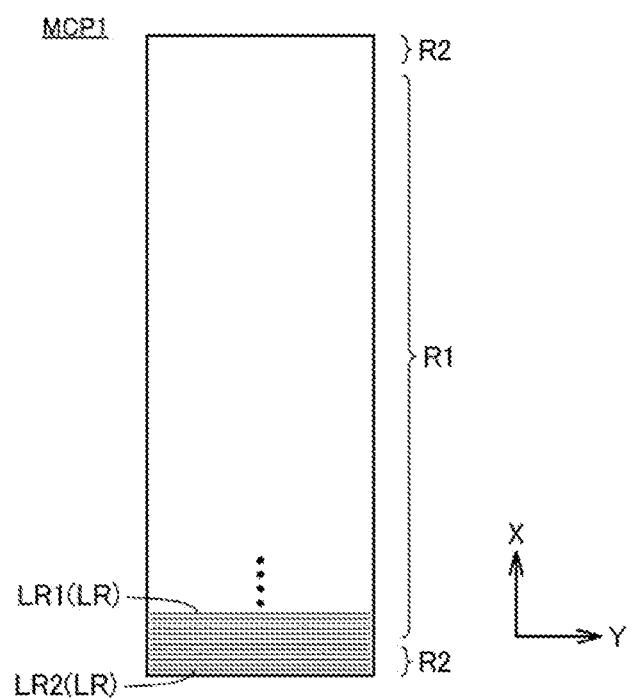
FIG. 1 is a plan view showing a first region and a second region of a semiconductor device according to a first embodiment.

Hereinafter, the embodiments will be described with reference to drawings. However, in the following description, the same or equivalent components are denoted by the same reference characters, and the repetitive description thereof will be omitted.

First Embodiment

Configuration of Semiconductor Device

A semiconductor device MCP1 according to the first embodiment a digital-to-analog converter including a ladder resistor circuit network. In the semiconductor device MCP1, a plurality of resistor elements for dividing voltage input to the ladder resistor circuit network are formed. The plurality of resistor elements are each disposed in an array.

As shown in FIG. 1, in plan view, the semiconductor device MCP1 extends along a first direction X and a second direction Y orthogonal to the first direction X. The semiconductor device MCP1 has a first region R1 and a second region R2. The first region R1 is disposed inside the second region R2 the first direction X. The first region R1 is continuous to the second region R2 in the first direction X. The second region R2 is positioned on the outermost side of the first direction X, in a region in which a real pattern constituting the ladder resistor circuit network in the semiconductor device MCP1 is formed, for example. The semiconductor device MCP1 does not have a dummy region in which a dummy pattern is formed, for example.

Figure 2:
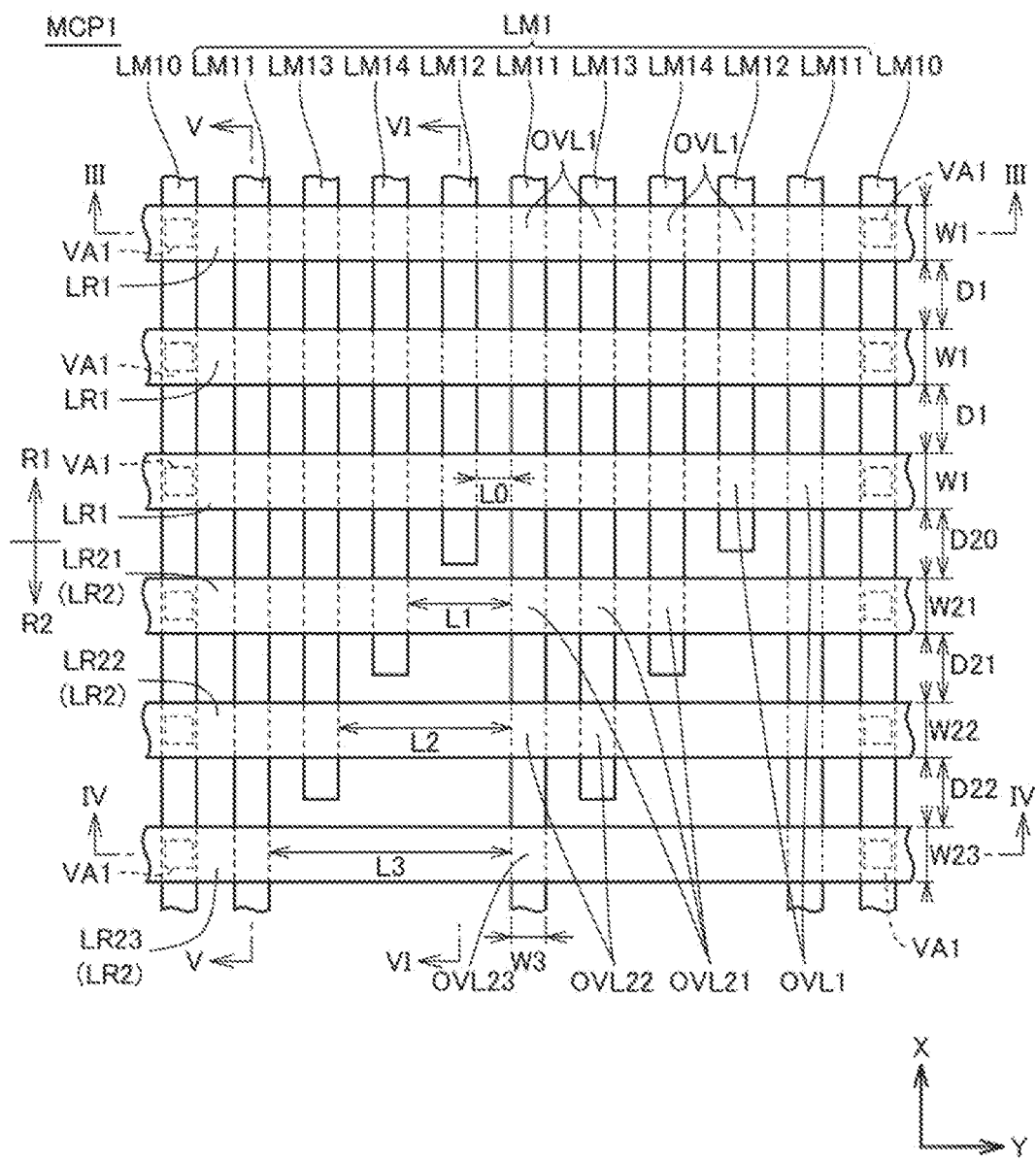
FIG. 2 is a plan view showing a plurality of resistor layers and a plurality of wiring layers of the semiconductor device according to the first embodiment.

As shown in FIG. 1 and FIG. 2, each of the plurality of resistor elements is formed in each of the first region R1 and the second region R2. The plurality of resistor elements formed in the second region R2 each have a structure substantially same as that of each of the plurality of resistor elements formed in the first region R1. Resistance values of the plurality of resistor elements are equal to each other. Here, that resistance values of the plurality of resistor elements are equal to each other means that a variation of the resistance value of each of the resistor elements falls within 0.2% of a design value. Resistance values of the plurality of resistor elements formed in the second region R2 are equal to each other and equal to resistance values of the plurality of resistor elements formed in the first region R1. In other words, with the resistance value of each of the plurality of resistor elements formed in the first region R1 as a reference, a variation of the resistance value of each of the plurality of resistor elements formed in the second region R2 falls within 0.2%.

Figure 3:
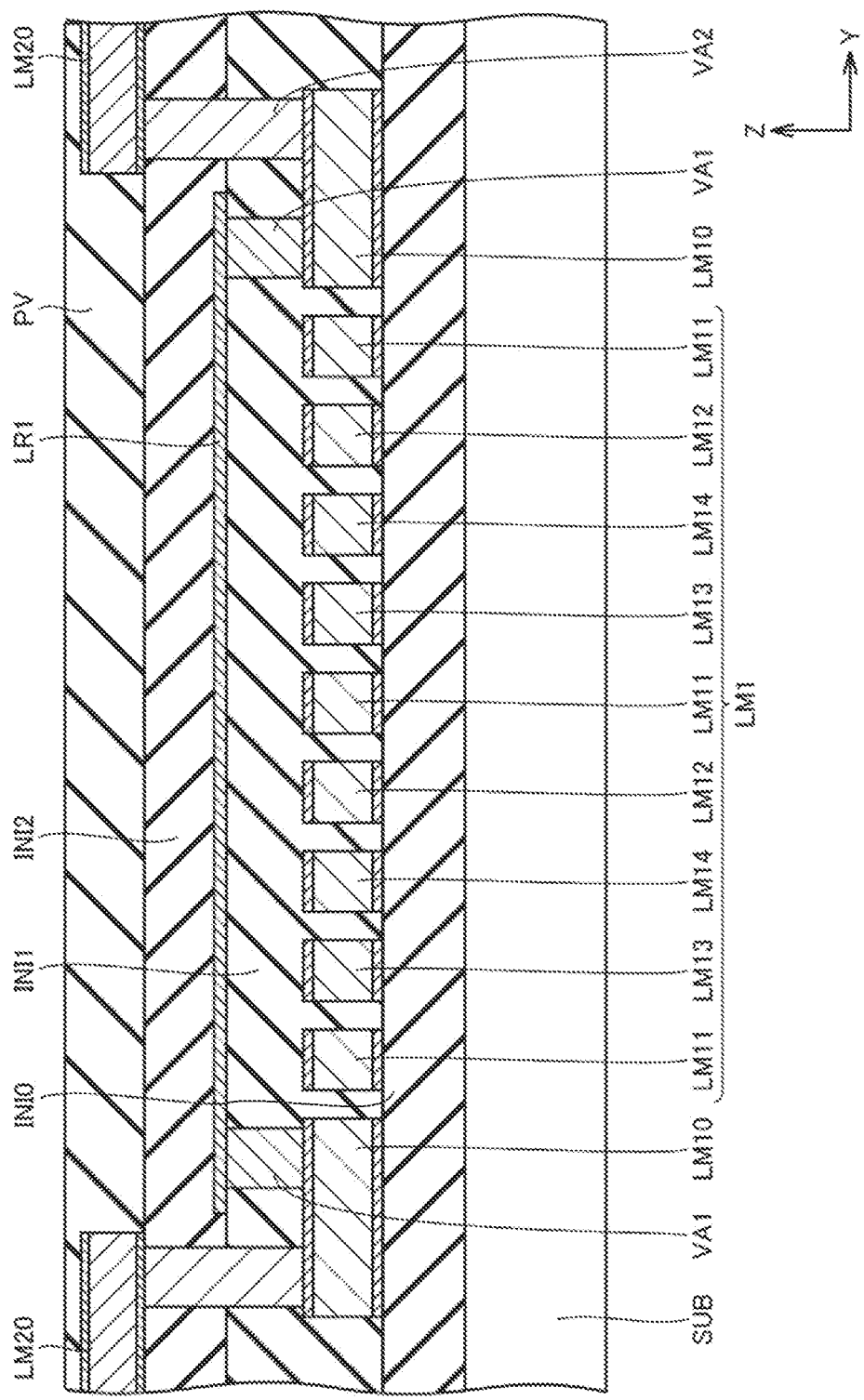
FIG. 3 is a cross-sectional view of the semiconductor device as viewed from an arrow III-III in FIG. 2.
Figure 4:
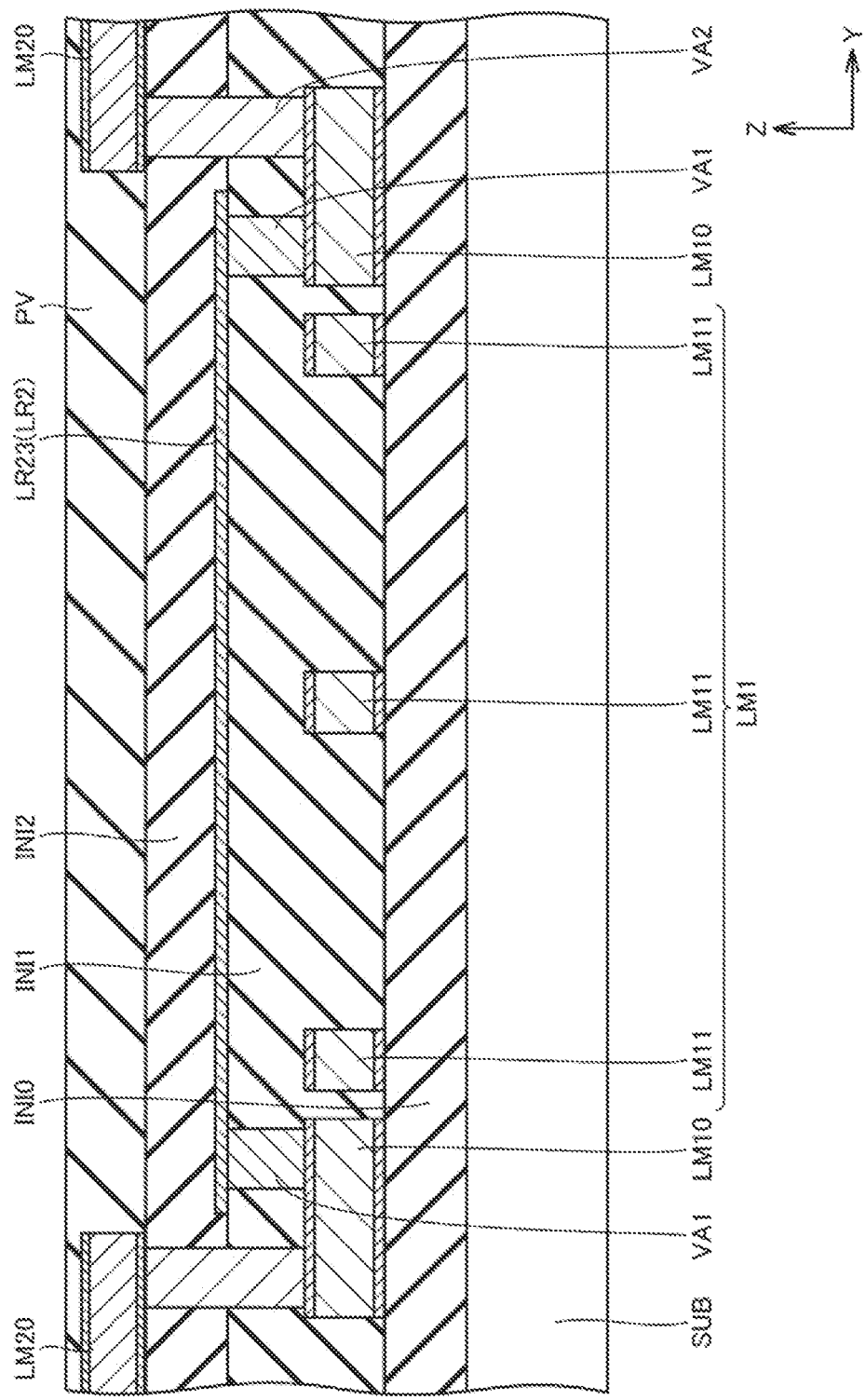
FIG. 4 is a cross-sectional view of the semiconductor device as viewed from an arrow IV-IV in FIG. 2.
Figure 5:
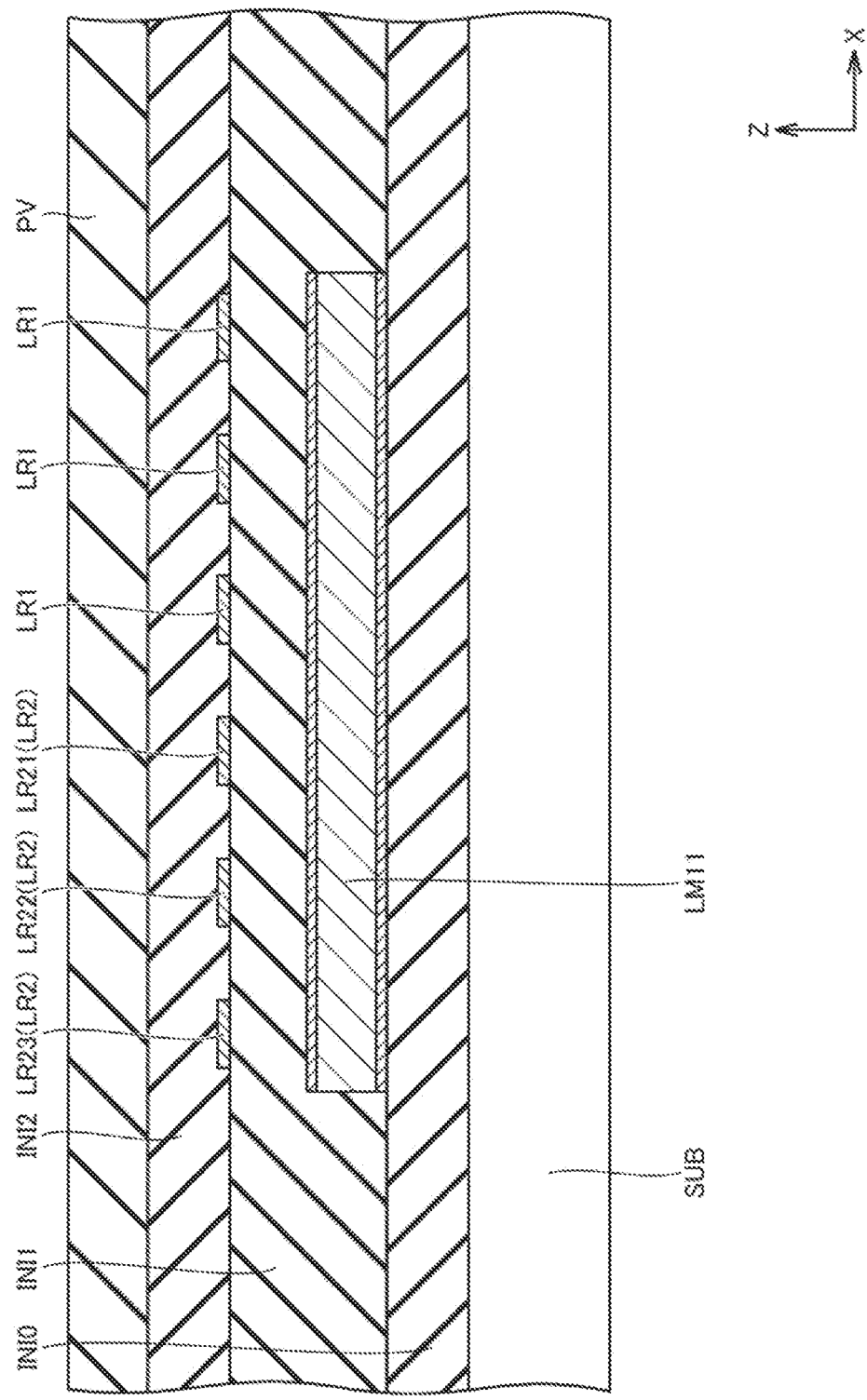
FIG. 5 is a cross-sectional view as viewed from an arrow V-V in FIG. 2.
Figure 6:
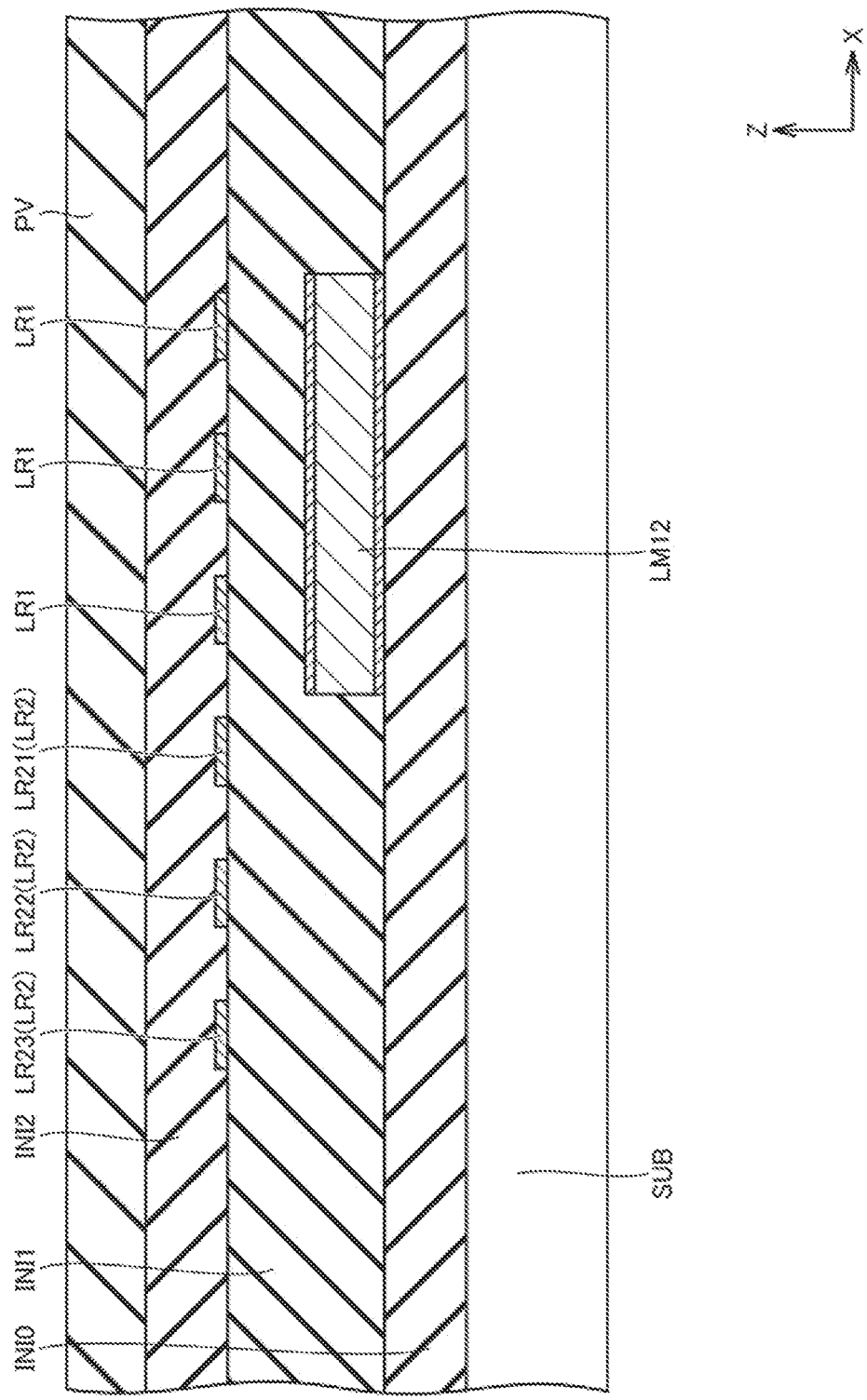
FIG. 6 is a cross-sectional view of the semiconductor device as viewed from an arrow VI-VI in FIG. 2.

As shown in FIG. 2 to FIG. 4, the semiconductor device MCP1 includes, for example, a semiconductor substrate SUB, an interlayer insulation layer INI0, a wiring layer LM1, a lower wiring layer LM10, an interlayer insulation layer INI1, a plurality of resistor layers LR, an interlayer insulation layer INI2, an upper wiring layer LM20, and a passivation film PV. A part of each of the wiring layer LM1, the lower wiring layer LM10, the interlayer insulation layer INI1, the plurality of resistor layers LR, the interlayer insulation layer INI2, the upper wiring layer LM20, and the passivation film PV is formed on the first region R1. The other part of each of the wiring layer LM1, the lower wiring layer LM10, the interlayer insulation layer INI1, the plurality of resistor layers LR, the interlayer insulation layer INI2, the upper wiring layer LM20, and the passivation film PV is formed on the second region R2.

The interlayer insulation layer INI0 is formed over an upper surface of the semiconductor substrate SUB. The wiring layer LM1 and a pair of lower wiring layers LM10 are disposed in contact with an upper surface of the interlayer insulation layer INI0. The wiring layer LM1 and the pair of lower wiring layers LM10 are buried in the interlayer insulation layer INI1. The interlayer insulation layer INI1 is disposed in contact with the upper surface of the interlayer insulation layer INI0. An upper surface of the interlayer insulation layer INI1 formed on each of the first region R1 and the second region R2 is planarized. The plurality of resistor layers LR are disposed in contact with the upper surface of the interlayer insulation layer INI1. The resistor layer LR is buried in the interlayer insulation layer INI2. The interlayer insulation layer INI2 is disposed in contact with the upper surface of the inter layer insulation layer INI1. The upper wiring layer LM20 is disposed in contact with an upper surface of the interlayer insulation layer INI2. The upper wiring layer LM20 is buried in the passivation film PV, for example.

In each of the first region R1 and the second region R2, each of the plurality of resistor elements is formed between the semiconductor substrate SUB and the passivation film PV. Each of the plurality of resistor elements includes the resistor layer LR, the pair of lower wiring layers LM10, a pair of upper wiring layers LM20, and the wiring layer LM1.

Each of the plurality of resistor layers LR is disposed in contact with the upper surface of the interlayer insulation layer INI1. The respective resistor layers LR of the plurality of resistor elements are disposed at an interval so as to be spaced apart from each other in the first direction X, and extend in the second direction Y orthogonal to the first direction X. The respective resistor layers LR of the plurality of resistor elements are formed in the same layer. From a different perspective, the respective resistor layers LR of the plurality of resistor elements are manufactured in the same step of the method of manufacturing the semiconductor device, and heights of the resistor layers LR from a main surface (an upper surface) of the semiconductor substrate SUB are equal to each other.

A thickness of each of the plurality of resistor layers LR is equal to or more than 1 nm and equal to or less than 20 nm, for example. Preferably, the thickness of each of the plurality of resistor layers LR is equal to or less than 10 nm. Each of the plurality of resistor layers LR is made of a material containing a metal. In other words, each of the plurality of resistor layers LR is a thin-film metal resistor. The material included in each of the plurality of resistor layers LR includes at least one selected from a group consisting of silicon chromium (SiCr), silicon chromium doped with carbon (SiCrC), nickel chromium (NiCr), titanium nitride (TIN), and tantalum nitride (TaN).

Each of the pair of lower wiring layers LM10 is electrically connected with each of both ends of the resistor layers LR in the second direction Y through a via VA1. Each of the pair of upper wiring layers LM20 is electrically connected with each of the lower wiring layers LM10 through a via VA2.

Although it is sufficient if the material included in the semiconductor substrate SUB is any semiconductor material, it includes silicon (Si), for example. Although it is sufficient if the material included in each of the interlayer insulation layers INI0, INI1, and INI2 is any material having an electrical insulating property, it includes silicon dioxide ($SiO_2$) or silicon nitride ($Si_3N_4$), for example. Although it is sufficient if the material included in the passivation film PV is any material having an electrical insulating property, it includes silicon nitride ($Si_3N_4$) or polyimide, for example. A thermal expansion coefficient of the material included in the semiconductor substrate SUB is smaller than a thermal expansion coefficient of the material included in the interlayer insulation layer INI1. Although it is sufficient if the material included in each of the lower wiring layer LM10 and the upper wiring layer LM20 is any material having a conductive property, it includes aluminum (Al), for example.

The plurality of resistor elements formed in the first region R1 and the plurality of resistor elements formed in the second region R2 differ from each other in width in the first direction X and interval in the first direction X of each of the resistor layers LR.

As shown in FIG. 2, each of the plurality of resistor elements formed in the first region R1 has, as the resistor layer, the first resistor layer LR1. Each of the plurality of resistor elements formed in the second region R2 has, as the resistor layer, the second resistor layer LR2. The plurality of first resistor layers LR1 are disposed inside the plurality of second resistor layers LR2 in the first direction X.

Respective widths W1 of the first resistor layers LR1 in the first direction X are equal to each other. Respective intervals D1 between adjacent ones of the first resistor layers LR1 in the first direction X are equal to each other. That the widths W1 of the first resistor layers LR in the first direction X are equal to each other and the intervals D1 between adjacent ones of the first resistor layers LR1 are equal to each other means that a dimensional difference between the two first resistor layers LR1 adjacent to each other relative to a dimension of one of the two first resistor layers LR1 adjacent to each other is within 0.2%.

The width of each of the second resistor layers LR2 in the first direction X gradually becomes smaller as the second resistor layer LR2 is located closer to the outside in the first direction X. Specifically, a difference in width of each of the two second resistor layers LR2 in the first direction X that are adjacent to each other in the first direction X is larger than 0.2% of the width of one of the second resistor layers LR2 described above. The interval between adjacent ones of the second resistor layers LR2 in the first direction X gradually becomes larger, as the second resistor layer LR2 is located closer to the outside in the first direction X.

A width W21 of the second resistor layer LR21 in the first direction X adjacent to the first resistor layer LR21 in the first direction X is smaller than the width W1 of the first resistor layer LR1 in the first direction X. A width W22 of the second resistor layer LR22 in the first direction X adjacent to the second resistor layer LR21 in the first direction X is smaller than the width W21 of the second resistor layer LR21 in the first direction X. A width W23 of the second resistor layer LR23 in the first direction X adjacent to the second resistor layer LR22 in the first direction X is smaller than the width W22 of the second resistor layer LR22 in the first direction X.

An interval D21 between the second resistor layer LR21 and the second resistor layer LR22 in the first direction X is larger than an interval D20 between the first resistor layer LR1 and the second resistor layer LR21 in the first direction X. An interval D22 between the second resistor layer LR22 and the second resistor layer LR23 in the first direction X are larger than the interval D21 between the second resistor layer LR21 and the second resistor layer LR22 in the first direction X. Incidentally, that the intervals D20 to D22 and the widths W21 to W23 are varied means that, regarding the two second resistor layers LR2 to be compared with each other, a dimensional difference between both of the second resistor layers LR2 relative to a dimension of one of the second resistor layers LR2 is larger than 0.1%.

In the first region R1, the plurality of first resistor layers LR1 are relatively densely disposed in the second region R2, the plurality of second resistor layers LR2 are relatively sparsely disposed. A total value of an area occupied by the plurality of second resistor layers LR2 per unit area of the second region R2 is smaller than a total value of an area occupied by the plurality of first resistor layers LR1 per unit area of the first region R1.

As shown in FIG. 2 to FIG. 6, the wiring layer LM1 is disposed below the plurality of resistor layers LR in such a manner overlapping with the plurality of resistor layers LR, in plan view. The wiring layer LM1 is disposed in contact with the upper surface of the interlayer insulation layer INI0. A thickness of the wiring layer LM1 is larger than a thickness of the resistor layer LR. The wiring layer LM1 is formed in the same layer as the lower wiring layer LM10, for example. From a different perspective, the wiring layer LM1 and the lower wiring layer LM10 are formed in the same step in the method of manufacturing the semiconductor device, and respective heights from the main surface (upper surface) of the semiconductor substrate SUB are equal to each other.

The wiring layer LM1 includes a first wiring portion LM11, a second wiring portion LM12, a third wiring portion LM13, and a fourth wiring portion LM14, for example. Each of the first wiring portion LM11, the second wiring portion LM12, the third wiring portion LM13, and the fourth wiring portion LM14 extends in the first direction X and is disposed at an interval in the second direction Y so as to be spaced apart from each other. In other words, the first wiring portion LM11, the second wiring portion LM12, the third wiring portion LM13, and the fourth wiring portion LM14 extend in parallel to each other. Respective widths W3 of the first wiring portion LM11, the second wiring portion LM12, the third wiring portion LM13, and the fourth wiring portion LM14 in the second direction Y are equal to each other, for example.

The first wiring portion LM11, the third wiring portion LM13, the fourth wiring portion LM14, and the second wiring portion LM12 are disposed side by side in the second direction Y in this order, for example. An interval between the first wiring portion LM11 and the third wiring portion LM13 in the second direction Y, an interval between the third wiring portion LM13 and the fourth wiring portion LM14 in the second direction Y, and an interval between the fourth wiring portion LM14 and the second wiring portion LM12 in the second direction Y are equal to one another. These intervals described above are equal to the width W3 described above, for example.

The wiring layer LM1 includes a plurality of sets of wiring patterns, each set including the first wiring portion LM11, the second wiring portion LM12, the third wiring portion LM13, and the fourth wiring portion LM14, for example. The plurality of sets of wiring patterns are disposed side by side in the second direction Y. The wiring layer LM1 includes, for example, two sets of wiring patterns described above and one first wiring portion LM11.

The first wiring portion LM11 overlaps with each of the plurality of first resistor layers LR1 and each of the plurality of second resistor layers LR21, LR22, and LR23, in plan view. The first wiring portion LM11 includes a plurality of third overlapping regions in which the first wiring portion LM11 overlaps with each of the plurality of first resistor layers LR1, in plan view, a fourth overlapping region in which the first wiring portion LM11 overlaps with the second resistor layer LR21, in plan view, a fifth overlapping region in which the first wiring portion LM11 overlaps with the second resistor layer LR22, in plan view, and a sixth overlapping region in which the first wiring portion LM11 overlaps with the second resistor layer LR23, in plan view.

The second wiring portion LM12 overlaps with each of the plurality of first resistor layers LR1, in plan view. The second wiring portion LM12 includes a plurality of third overlapping regions in which the second wiring portion LM12 overlaps with any of the plurality of first resistor layers LR1, in plan view. The second wiring portion LM12 does not overlap with each of the plurality of second resistor layers LR21, LR22, and LR23, in plan view. The second wiring portion LM12 does not include a region in which the second wiring portion LM12 overlaps with each of the plurality of second resistor layers LR21, LR22, and LR23, in plan view.

The third wiring portion LM13 overlaps with each of the plurality of first resistor layers LR1, the second resistor layer LR21, and the second resistor layer LR22, in plan view. The third wiring portion LM13 includes a plurality of third overlapping regions in which the third wiring portion LM13 overlaps with any of the plurality of first resistor layers LR1, in plan view, the fourth overlapping region in which the third wiring portion LM13 overlaps with the second resistor layer LR21, in plan view, and the fifth overlapping region overlapping with the second resistor layer LR22, in plan view. The third wiring portion LM13 does not overlap with the second resistor layer LR23, in plan view. The third wiring portion LM13 does not include a region in which the third wiring portion LM13 overlaps with the second resistor layer LR23, in plan view.

The fourth wiring portion LM14 overlaps with each of the plurality of first resistor layers LR1 and the second resistor layer LR21, in plan view. The fourth wiring portion LM14 includes a plurality of third overlapping regions in which the fourth wiring portion LM14 overlaps with any of the plurality of first resistor layers LR1, in plan view, and the fourth overlapping region in which the fourth wiring portion LM14 overlaps with the second resistor layer LR21, in plan view. The fourth wiring portion LM14 does not overlap with each of the second resistor layer LR22 and the second resistor layer LR23, in plan view. The fourth wiring portion LM14 does not include a region overlapping with each of the second resistor layer LR22 and the second resistor layer LR23, in plan view.

From a different perspective, each of the plurality of first resistor layers LR1 has a plurality of first overlapping regions OVL1 each overlapping with the above-described third overlapping region of each of the first wiring portion LM11, the second wiring portion LM12, the third wiring portion LM13, and the fourth wiring portion LM14, in plan view. One of the first overlapping regions OVL1 overlaps with one of the third overlapping regions described above, plan view. A width of each of the first overlapping regions OVL1 in the first direction X is equal to the width of each of the first resistor layers LR1 in the first direction X. A width of each of the first overlapping regions OVL1 in the second direction Y is equal to a width of each of the first wiring portion LM11, the second wiring portion LM12, the third wiring portion LM13, and the fourth wiring portion LM14 in the second direction Y. An interval between adjacent ones of the first overlapping regions OVL1 in the second direction Y is equal to the interval between the first wiring portion LM11 and the third wiring portion LM13 in the second direction Y, the interval between the third wiring portion LM13 and the fourth wiring portion LM14 in the second direction Y, the interval between the fourth wiring portion LM14 and the second wiring portion LM12 in the second direction Y, and the interval between the second wiring portion LM12 and the first wiring portion LM11 in the second direction Y.

The second resistor layer LR21 has a plurality of second overlapping regions OVL21 each overlapping with the above-described fourth overlapping region of each of the first wiring portion LM11, the third wiring portion LM13, and the fourth wiring portion LM14, in plan view. One of the second overlapping regions OVL21 overlaps with one of the fourth overlapping regions described above, in plan view. The second resistor layer LR21 does not have a region overlapping with the second wiring portion LM12, in plan view. A width of each of the second overlapping regions OVL21 in the first direction X is equal to the width of the second resistor layer LR21 in the first direction X. A width of the second overlapping region OVL21 in the second direction Y is equal to the width of each of the first wiring portion LM11, the second wiring portion LM12, and the third wiring portion LM13 in the second direction Y.

A maximum value L1 of an interval between adjacent ones of the second overlapping regions OVL21 in the second direction Y (a maximum length of a non-overlapping region in the second direction Y being located between adjacent ones of the second overlapping regions OVL21 and not overlapping with the wiring layer LM1 in plan view) is longer than an interval L0 between adjacent ones of the first overlapping regions OVL1 in the second direction Y. The maximum value L1 equal to a distance between the fourth wiring portion LM14 and the first wiring portion LM11 in the second direction Y that are disposed to sandwich the second wiring portion LM12 therebetween. A minimum value of the interval between adjacent ones of the second overlapping regions OVL21 in the second direction Y is equal to the interval between the first wiring portion LM11 and the third wiring portion LM13 in the second direction Y, the interval between the third wiring portion LM13 and the fourth wiring portion LM14 in the second direction Y, the interval between the fourth wiring portion LM14 and the second wiring portion LM12 the second direction and the interval between the second wiring portion LM12 and the first wiring portion LM11 in the second direction Y.

The second resistor layer LR22 has a plurality of second overlapping regions OVL22 each overlapping with the fifth overlapping region of each of the first wiring portion LM11 and the third wiring portion LM13, in plan view. One of the second overlapping regions OVL22 overlaps with one of the fifth overlapping regions, plan view. The second resistor layer LR22 does not have a region overlapping with each of the second wiring portion LM12 and the fourth wiring portion LM14, in plan view. A width of each of the second overlapping regions OVL22 in the first direction X is equal to the width of the second resistor layer LR22 in the first direction X. A width of each of the second overlapping regions OVL22 in the second direction Y is equal to the width of each of the first wiring portion LM11 and the second wiring portion LM12 in the second direction Y.

A maximum value L2 of an interval between adjacent ones of the second overlapping regions OVL22 in the second direction Y (a maximum length of a non-overlapping region in the second direction Y being located between adjacent ones of the second overlapping regions OVL22 and not overlapping with the wiring layer LM1 in plan view) is longer than the maximum value L1. The maximum value L2 is equal to a distance between the third wiring portion LM13 and the first wiring portion LM11 in the second direction Y that are disposed to sandwich the second wiring portion LM12 and the fourth wiring portion LM14 therebetween. A minimum value of the interval between adjacent ones of the second overlapping regions OVL22 in the second direction Y is equal to the interval between the first wiring portion LM11 and the third wiring portion LM13 in the second direction Y, the interval between the third wiring portion LM13 and the fourth wiring portion LM14 in the second direction Y, the interval between the fourth wiring poi ion LM14 and the second wiring portion LM12 in the second direction Y, and the interval between the second wiring portion LM12 and the first wiring portion LM11 in the second direction Y.

The second resistor layer LR23 has a plurality of second overlapping regions OVL23 each overlapping with the sixth overlapping region of the first wiring portion LM11, in plan view. The second resistor layer LR23 does not have a region overlapping with each of the second wiring portion LM12, the third wiring portion LM13, and the fourth wiring portion LM14, in plan view.

A width of each of the second overlapping regions OVL23 in the first direction X is equal to the width of the second resistor layer LR23 in the first direction X. A width of the second overlapping region OVL23 in the second direction Y is equal to the width W3 of the first wiring portion LM11 in the second direction Y. A maximum value L3 of an interval between adjacent ones of the second overlapping regions OVL23 in the second direction Y (a maximum length of a non-overlapping region in the second direction Y being located between adjacent ones of the second overlapping regions OVL23 and not overlapping with the wiring layer LM1 in plan view) is longer than the maximum value L2. The maximum value L3 is equal to a distance between one first wiring portion LM11 and another first wiring portion LM11 in the second direction Y that are disposed to sandwich the second wiring portion LM12, the third wiring portion LM13, and the fourth wiring portion LM14 therebetween. A minimum value of the interval between adjacent ones of the second overlapping regions OVL23 in the second direction Y is equal to the interval between the first wiring portion LM11 and the third wiring portion LM13 in the second direction Y, the interval between the third wiring portion LM13 and the fourth wiring portion LM14 in the second direction Y, the interval between the fourth wiring portion LM14 and the second wiring portion LM12 in the second direction Y, and the interval between the second wiring portion LM12 and the first wiring portion LM11 in the second direction Y.

A total value of respective areas of the plurality of second overlapping regions of each of the second resistor layers LR2 is smaller than a total value of respective areas of the plurality of first overlapping regions OVL1 of each of the first resistor layers LR1. The total value of the respective areas of the plurality of second overlapping regions of each of the second resistor layers LR2 is different depending on a position of the second resistor layer LR2 in the first direction X. A total value of respective areas of the plurality of second overlapping regions of the second resistor layer LR2 that is located relatively closer to the outside in the first direction X is smaller than a total value of respective areas of the plurality of second overlapping regions of the second resistor layer LR2 that is located relatively closer to the inner side in the first direction X. A total value of respective areas of the plurality of second overlapping regions of the second resistor layer LR2 that is located on the outermost side is smallest in the total values of respective areas of the second overlapping regions of each of the second resistor layers LR2.

A value obtained by dividing the total value of the respective areas of the plurality of second overlapping regions of each of the second resistor layers LR2 by the width of each of the second resistor layers LR2 in the first direction X is smaller than a value obtained by dividing the total value of the respective areas of the plurality of first overlapping regions OVL1 of each of the first resistor layers LR1 by the width of each of the first resistor layers LR1 in the first direction X. A value obtained by dividing the total value of the respective areas of the plurality of second overlapping regions of the second resistor layer LR2 that is located relatively closer to the outside in the first direction X by the width of each of the second resistor layers LR2 in the first direction X is smaller than a value obtained by dividing the total value of the respective areas of the plurality of second overlapping regions of the second resistor layer LR2 that is located relatively closer to the inner side in the first direction X by the width of each of the second resistor layers LR2 in the first direction X. A value obtained by dividing the total value of the respective areas of the plurality of second overlapping regions of the second resistor layer LR2 that is located on the outermost side in the first direction X by the width of the second resistor layer LR2 in the first direction X that is located on the outermost side in the first direction X is smallest in the values obtained by dividing the total values of the respective areas of the second overlapping regions of each of second resistor layers LR2 by the width of each of the second resistor layers LR2 in the first direction X.

A ratio (data ratio) occupied by each of the plurality of second overlapping regions of each of the second resistor layers LR2 per unit area smaller than a ratio occupied by each of the plurality of first overlapping regions OVL1 of each of the first resistor layers LR1 per unit area. A ratio occupied by each of the plurality of second overlapping regions of the second resistor layer LR2 that is relatively closer to the outside in the first direction X per unit area is smaller than a ratio occupied by each of the plurality of second overlapping regions of the second resistor layer LR2 that is relatively closer to the inner side in the first direction X per unit area. A ratio occupied by each of the second overlapping regions of the second resistor layer LR2 that is located on the outermost side in the first direction X per unit area is smallest in the ratios occupied by each of the second overlapping regions of each of the second resistor layers LR2 per unit area.

A total value (total area) of respective areas of the plurality of second overlapping regions OVL21 of the second resistor layer LR21 is smaller than a total value of respective areas of the plurality of first overlapping regions OVL1 of one of the first resistor layers LR1. A value (a second value) obtained by dividing the total value of the respective areas of the plurality of second overlapping regions OVL21 of the second resistor layer LR21 by the width W21 of the second resistor layer LR21 in the first direction X is smaller than a value (a first value) obtained by dividing the total value of the respective areas of the plurality of first overlapping regions OVL1 of the first resistor layers LR1 by the width W1 of the first resistor layer LR1 in the first direction X.

A total value of respective areas of the plurality of second overlapping regions OVL22 of the second resistor layer LR22 is smaller than a total value of respective areas of the plurality of second overlapping regions OVL21 of the second resistor layer LR21. A value (a third value) obtained by dividing the total value of the respective areas of the plurality of second overlapping regions OVL22 of the second resistor layer LR22 by the width W22 of the second resistor layer LR22 in the first direction X is smaller than each of the first value and the second value.

A total value of respective areas of the plurality of second overlapping regions OVL23 of the second resistor layer LR23 is smaller than the total value of the respective areas of the plurality of second overlapping regions OVL22 of the second resistor layer LR22. A value (a fourth value) obtained by dividing the total value of the respective areas of the plurality of second overlapping regions OVL23 of the second resistor layer LR23 by the width W23 of the second resistor layer LR23 in the first direction X is smaller than each of the first value, the second value, and the third value.

Method of Manufacturing Semiconductor Device

Figure 7:
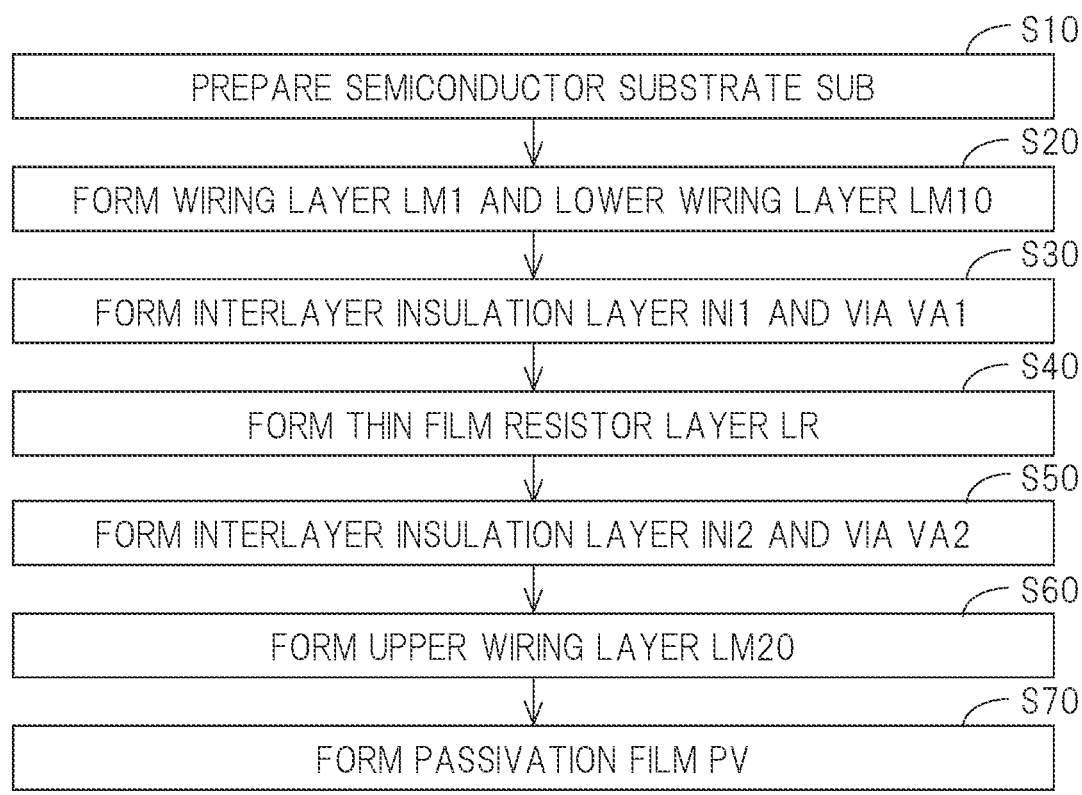
FIG. 7 is a flow chart of a method of manufacturing the semiconductor device according to the first embodiment.

As shown in FIG. 7, in the method of manufacturing the semiconductor device MCP1, first, a semiconductor substrate SUB is prepared (step S10). In step S10, the semiconductor substrate SUB having an interlayer insulation layer INI0 formed over an upper surface thereof is prepared.

Figure 8:
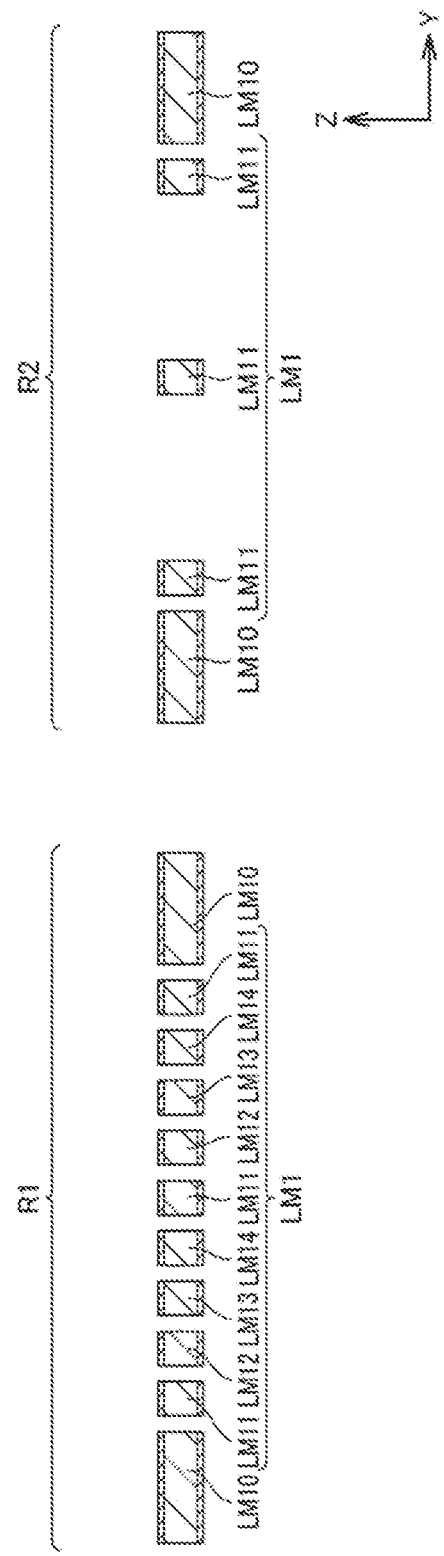
FIG. 8 is a cross-sectional view showing a first step in the method of manufacturing the semiconductor device according to the first embodiment.

Secondly, a wiring layer LM1 and a lower wiring layer LM10 are formed on the semiconductor substrate SUB with the interlayer insulation layer INI0 interposed therebetween (step S20). In step S20, first, a metal film is formed over an upper surface of the interlayer insulation layer INI0. Secondly, the metal film is patterned by photolithography. Accordingly, as shown in FIG. 8, the wiring layer LM1 and the lower wiring layer LM10 are each formed from the metal film. Note that, in FIG. 8 to FIG. 12, illustration of the semiconductor substrate SUB and the interlayer insulation layer INI0 is omitted.

Figure 9:
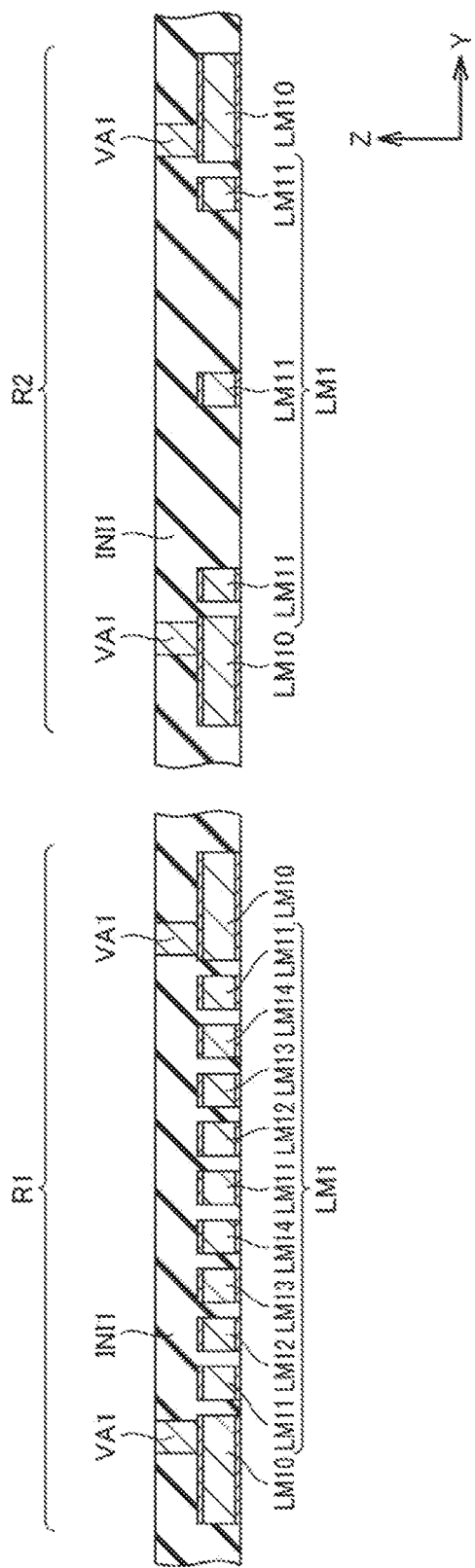
FIG. 9 is a cross-sectional view showing a second step in the method of manufacturing the semiconductor device according to the first embodiment, after the first step shown in FIG. 8.

Thirdly, an interlayer insulation layer INI1 and a via VA1 are formed on the wiring layer LM1 and the lower wiring layer LM10 (step S30). In step S30, first, an interlayer insulation film is formed over the interlayer insulation layer INI0, the wiring layer LM1, and the lower wiring layer LM10. Secondly, the interlayer insulation film is subjected to planarization processing. The planarization processing is, for example, chemical mechanical polishing (CMP). Thirdly, a contact hole is formed in the interlayer insulation film. The contact hole is formed in such a manner as to open part of the lower wiring layer LM10. Fourthly, a conductive film is formed in such a manner as to bury the interior of the contact hole. A material included in the conductive film includes tungsten (W), for example. Fifthly, part of the conductive film and part of the interlayer insulation film are removed by the CMP. In this manner, as shown in FIG. 9, the interlayer insulation layer INI1 is formed from the interlayer insulation film, and the via VA1 is formed from the conductive film. A size of the wiring layer LM1 in the present step S30 is set on the basis of an estimated value of a dimensional variation of the resistor layer LR that is expected in step S40. The estimated value of the dimensional variation of the resistor layer LR is obtained from a preliminary experiment or the like.

Fourthly, the resistor layer LR is formed on the interlayer insulation layer INI1 and the via VA1 (step S40). In step S40, first, a metal resistive thin film is formed over the interlayer insulation layer INI1 and the via VA1. Secondly, the metal resistive thin film is patterned by photolithography. More specifically, a photosensitive thin film is subjected to exposure and development by use of an optical mask (reticle), and a masking pattern for patterning the resistor layer is thus formed. Next, with the masking pattern used as an etching mask, the metal resistive thin film that is exposed in an opening portion of the masking pattern is removed.

In the optical mask, dimensions of the patterns for forming a plurality of resistor layers LR are equal to each other. In contrast, a thickness of the photosensitive thin film becomes larger as the photosensitive thin film is closer to the outside in the first direction X. Since the thickness of the photosensitive thin film is slightly varied in the first direction X, an area ratio of each opening portion of the mask pattern becomes lower as the opening portion is closer to the outside in the first direction X. Accordingly, an etching rate of the resistor layer in the second region R2 is increased more than an etching rate of the resistor layer in the first region R1, and in addition, the etching rate of the resistor layer in the second region R2 is further increased as the resistor layer is closer to the outside in the first direction X (micro-loading effect).

Figure 10:
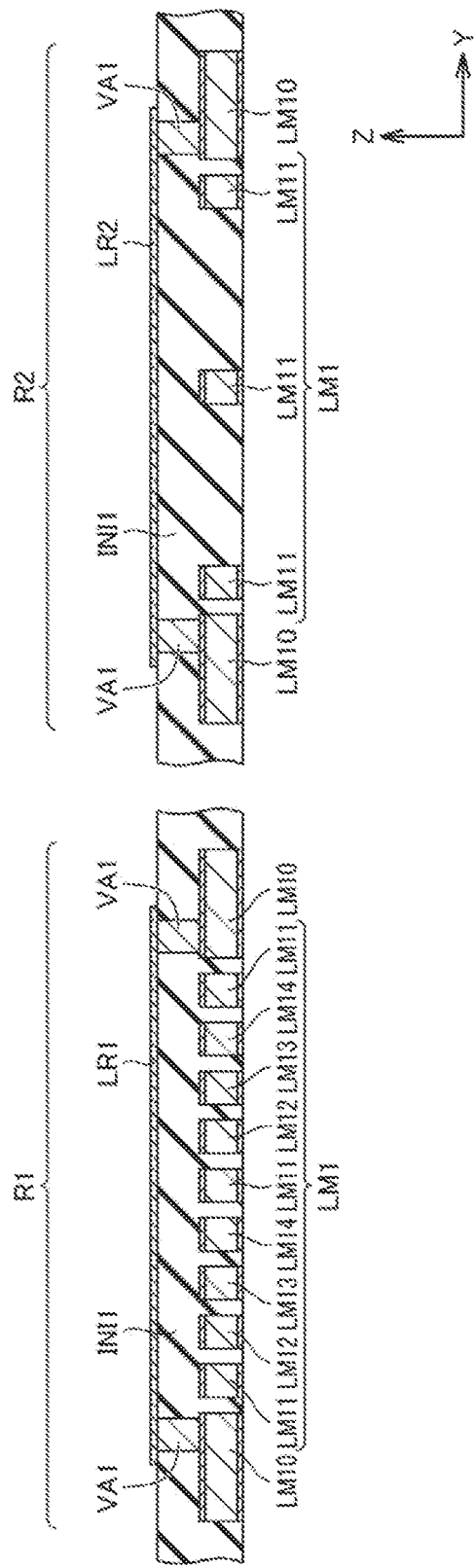
FIG. 10 is a cross-sectional view showing a third step in the method of manufacturing the semiconductor device according to the first embodiment, after the second step shown in FIG. 9.

Hence, as shown in FIG. 10, a plurality of first resistor layers LR1 and a plurality of second resistor layers LR2 are formed from the metal resistive thin film. Variations in width and interval of the second resistor layer LR2 in the first direction X described above are caused by the micro-loading effect described above.

Figure 11:
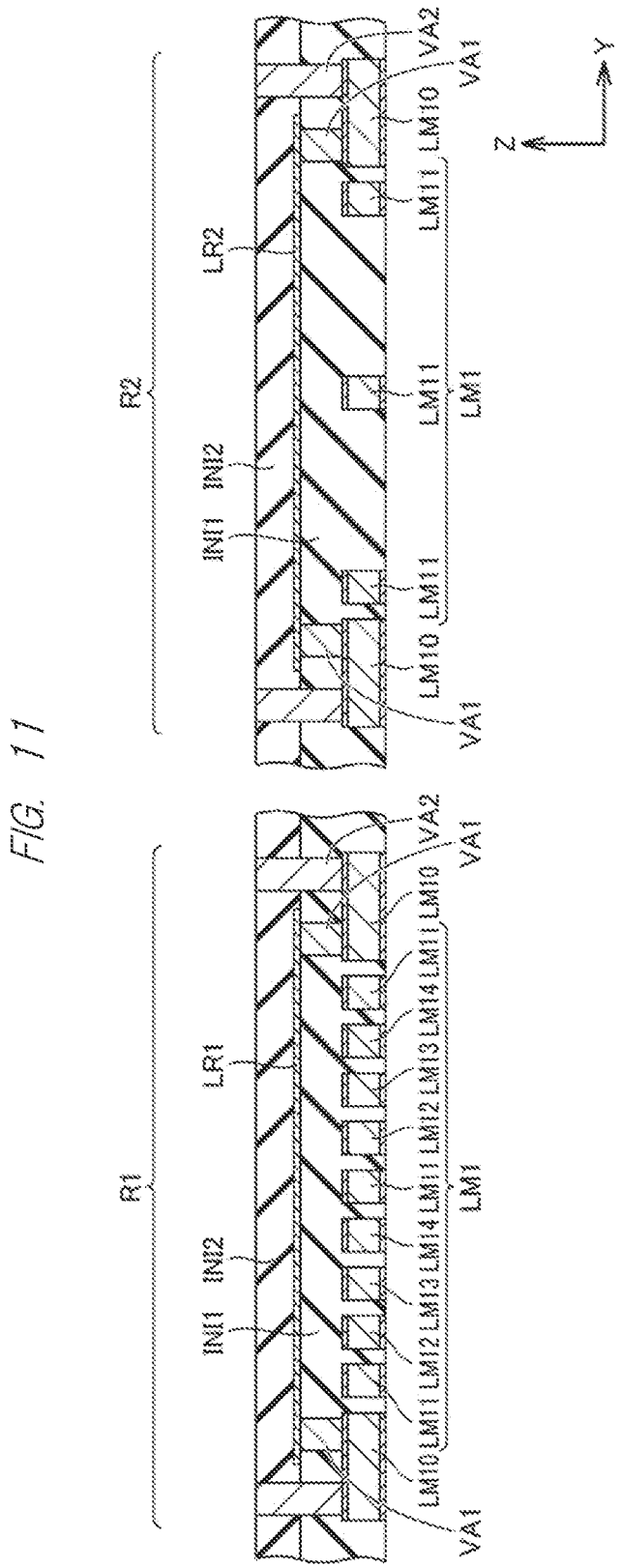
FIG. 11 is a cross-sectional view showing a fourth step in the method of manufacturing the semiconductor device according to the first embodiment, after the third step shown in FIG. 10.

Fifthly, an interlayer insulation layer INI2 and a via VA2 are formed on the resistor layer LR (step S50). In step S50, first, an interlayer insulation film is formed over the interlayer insulation layer INI1, the plurality of first resistor layers LR1, and the plurality of second resistor layers LR2. Secondly, the interlayer insulation film is subjected to planarization processing. The planarization processing is chemical mechanical polishing (CMP), for example. Thirdly, a contact hole is formed in the interlayer insulation film. The contact hole is formed in such a manner as to open another part of the lower wiring layer LM10. Fourthly, a conductive film is formed in such a manner as to bury the interior of the contact hole. A material included in the conductive film includes tungsten (W), for example. Fifthly, part of the conductive film and part of the interlayer insulation film are removed by CMP. In this manner, as shown in FIG. 11, the interlayer insulation layer INI2 is formed from the interlayer insulation film, and the via VA2 is formed from the conductive film.

Sixthly, an upper wiring layer LM20 is formed on the interlayer insulation layer INI2 and the via VA2 (step S60). In step S60, first, a metal film is formed over upper surfaces of the interlayer insulation layer INI2 and the via VA2. Secondly, the metal film is patterned by photolithography. Accordingly, the upper wiring layer LM20 is formed from the metal film.

Figure 12:
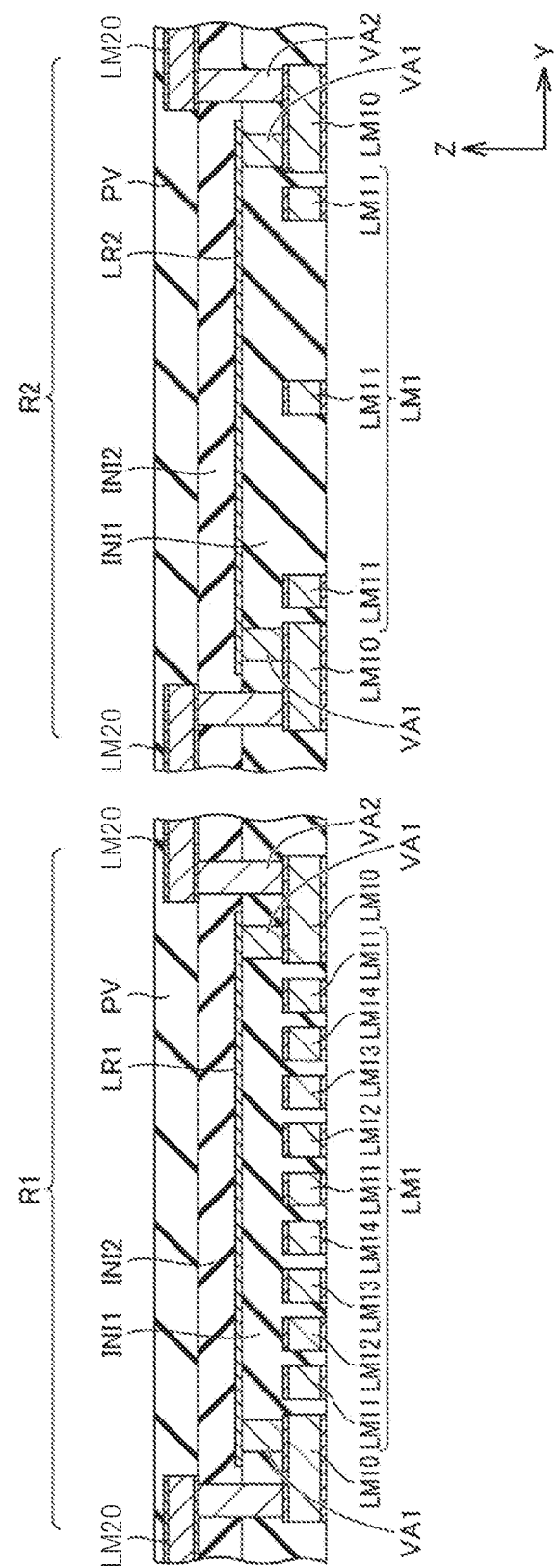
FIG. 12 is a cross-sectional view showing a fifth step in the method of manufacturing the semiconductor device according to the first embodiment, after the fourth step shown in FIG. 11.

Seventhly, a passivation film PV is formed over the upper wiring layer LM20 (step S70). In step S70, first, the passivation film PV is formed over upper surfaces of the interlayer insulation layer INI2 and the upper wiring layer LM20. In this manner, as shown in FIG. 12, a plurality of resistor elements are formed between the semiconductor substrate SUB and the passivation film PV.

Effect of Semiconductor Device

An effect of the semiconductor device MCP1 will be described as compared with a semiconductor device according to a first comparative example shown in FIG. 13.

Figure 13:
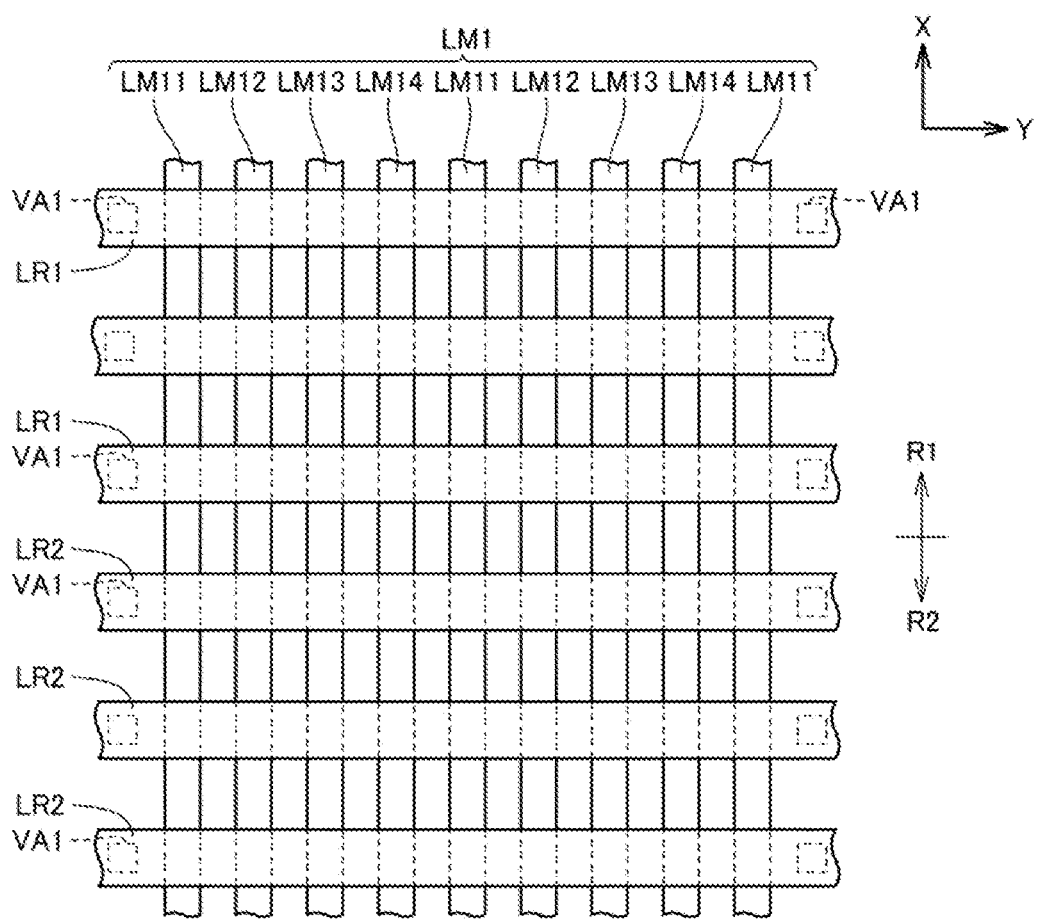
FIG. 13 is a plan view showing a plurality of resistor layers and a plurality of wiring layers of a semiconductor device according to a first comparative example.

In the semiconductor device according to the first comparative example shown in FIG. 13, as in the semiconductor device MCP1, the width of each of the second resistor layers LR2 in the first direction X is smaller than the width of each of the first resistor layers LR1 in the first direction X due to the micro-loading effect, and as a result, the total value of the respective areas of the plurality of second overlapping regions of each of the second resistor layers LR2 is smaller than the total value of the respective areas of the plurality of first overlapping regions OVL1 of each of the first resistor layers LR1. In contrast, the semiconductor device according to the first comparative example is different from the semiconductor device MCP1 in that a value obtained by dividing the total value of the respective areas of the plurality of second overlapping regions of each of the second resistor layers LR2 by the width of the second resistor layer LR2 in the first direction X is equal to a value obtained by dividing the total value of the respective areas of the plurality of first overlapping regions OVL1 of each of the first resistor layers LR1 by the width of the first resistor layer LR1 in the first direction X.

Figure 14:
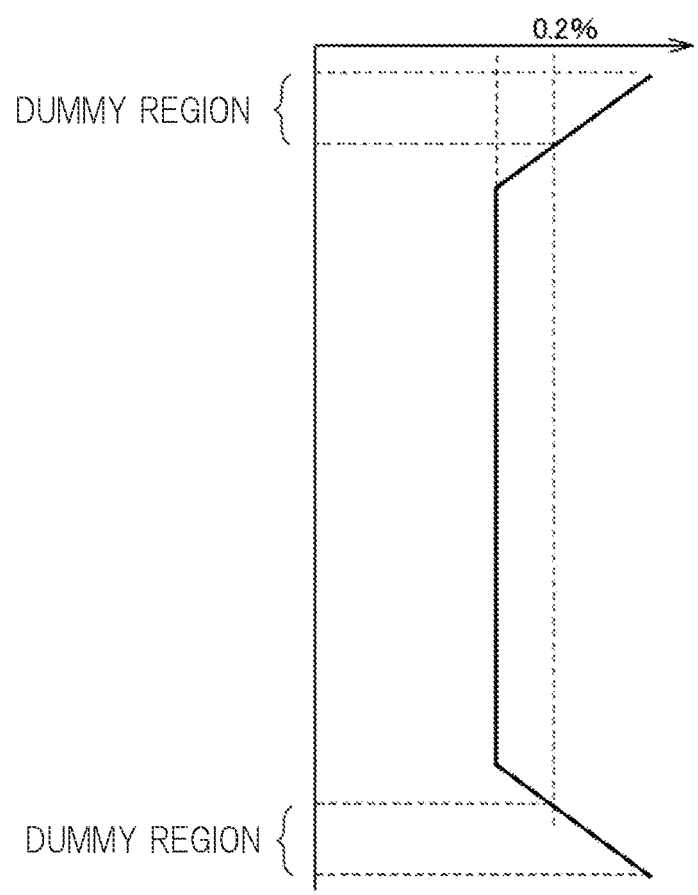
FIG. 14 is a diagram indicating a variation rate of a resistance value of a resistor layer in the semiconductor device according to the first comparative example.

In the first comparative example shown in FIG. 13, due to the micro-loading effect, a resistance value of the second resistor layer LR2 is higher than a resistance value of the first resistor layer LR1, and its increase rate is larger than 0.2% (see FIG. 14). Accordingly, the semiconductor device in which an allowable value of a variation rate of the resistance value of each resistor element falls within 0.2% needs to secure the number of resistor elements whose variation rate of the resistance value falls within 0.2% by making the first region wider and to set the second region R2 as a dummy region, thereby making it difficult to downsize plane dimensions of the semiconductor device.

The present inventors have experimentally confirmed that, as a value obtained by dividing a total value of areas of overlapping regions of a resistor layer and a wiring layer by a width of the resistor layer becomes smaller, a resistance value of the resistor layer becomes smaller.

Figure 15:
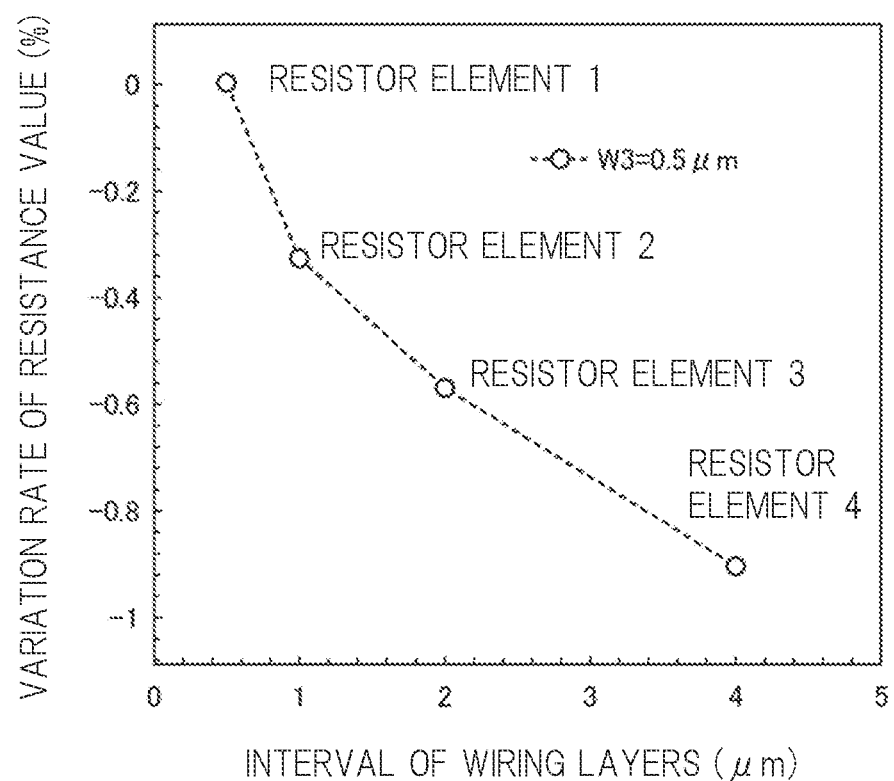
FIG. 15 is a graph indicating that, when resistor elements in which intervals between adjacent ones of the plurality of wiring layers in a second direction are different from each other are compared with each other, a resistance value of one resistor layer of each of the resistor elements has been varied according to an interval between adjacent ones of the plurality of wiring layers in the second direction.

FIG. 15 is a graph indicating that, when resistor elements 1 to 4 in which intervals between adjacent ones of the plurality of wiring layers LM1 in the second direction Y are different from each other are compared with each other, a resistance value of one resistor layer LR of each of the resistor elements 1 to 4 has been varied according to an interval between adjacent ones of the plurality of wiring layers LM1 in the second direction Y. An axis of abscissas in FIG. 15 indicates an interval between adjacent ones of the plurality of wiring layers LM1 (μm) in the second direction Y, and an axis of ordinate in FIG. 15 indicates a variation rate (%) of a resistance value of each of the resistor elements 1 to 4, with a resistance value of the resistor element 1 as a reference. A width of each of the plurality of wiring layers LM1 of each of the resistor elements in the second direction Y was set to be 0.5 μm. A length of each of the plurality of wiring layers LM1 of each of the resistor elements in the first direction X was set to be 5 μm or more. A width of each of the resistor layers LR of each of the resistor elements in the first direction X was set to be 5 μm, and a length of the resistor layer LR in the second direction Y was set to be 25 μm. An interval between adjacent ones of the plurality of wiring layers LM1 of the resistor element 1 in the second direction Y was set to be 0.5 μm, an interval between adjacent ones of the plurality of wiring layers LM1 of the resistor element 2 in the second direction Y was set to be 1.0 μm, an interval between adjacent ones of the plurality of wiring layers LM1 of the resistor element 3 in the second direction Y was set to be 2.0 μm, and an interval between adjacent ones of the plurality of wiring layers LM1 of the resistor element 4 in the second direction Y was set to be 4.0 μm. A data ratio of the resistor element 1 was set to be 50%, a data ratio of the resistor element 2 was set to be 33%, a data ratio of the resistor element 3 was set to be 20%, a data ratio of the resistor element 4 was set to be 11%. In the resistor elements 1 to 4, as the interval between adjacent ones of the plurality of wiring layers LM1 in the second direction Y is longer, a distance between overlapping regions of the resistor layer LR and the wiring layer LM1 becomes longer, and accordingly, a value obtained by dividing a total value of areas of the overlapping regions of the resistor layer LR and the wiring layer LM1 by the width of the resistor layer LR becomes small. As indicated in FIG. 15, as an interval between adjacent ones of the plurality of wiring layers LM1 in the second direction Y was longer and the value obtained by dividing the total value of the areas of the overlapping regions of the resistor layer LR and the wiring layer LM1 by the width of the resistor layer LR became smaller, the resistance value was decreased.

The result of the experiment above will be described below. A resistance value of the resistor layer LR as a thin film metal resistor is decreased as a stress applied to the resistor layer LR is larger. For example, in a film-forming step of forming the interlayer insulation layer INI2 or the passivation film PV over the semiconductor substrate SUB or other steps, generation of the stress to be applied to the resistor layer LR is caused by a difference in thermal expansion coefficient between the semiconductor substrate SUB and the interlayer insulation layer INI2 or the passivation film PV. In plan view, the wiring layer LM1 that is disposed in such a manner as to overlap with the resistor layer LR buffers the stress applied to the resistor layer LR with the interlayer insulation layer INI1 interposed therebetween. Hence, as the value obtained by dividing the total value of the areas of the overlapping regions of the resistor layer LR and wiring layer LM1 by the width of the resistor layer LR becomes smaller, the stress applied to the resistor layer LR becomes larger, and as a result, the resistance value of the resistor layer LR is likely to be decreased.

According to the above description, in the semiconductor device MCP1, a value obtained by dividing the total value of the respective areas of the plurality of second overlapping regions of each of the second resistor layer LR2 by the width of the second resistor layer LR2 in the first direction X is set to be smaller than a value obtained by dividing the total value of the respective areas of the plurality of first overlapping regions OVL1 of each of the first resistor layers LR1 by the width of the first resistor layers LR1 in the first direction X. Consequently, in the semiconductor device MCP1, the stress applied to the second resistor layer LR2 with a relatively small width is larger than the stress applied to the first resistor layer LR1 with a relatively large width. As a result, a decrease rate of the resistance value of the second resistor layer LR2 due to the stress is larger than a decrease rate of the resistance value of the first resistor layer LR1, and a variation in resistance value caused by a difference in width in the first direction X between the first resistor layer LR1 and the second resistor layer LR2 can be reduced. Specifically, in the semiconductor device MCP1, without providing an outer peripheral portion (dummy region) that is not used for a circuit, a variation in resistance value of the resistor layer LR in each of the first region R1 and the second region R2 can further be reduced, as compared with the semiconductor device according to the first comparative example.

Moreover, the present inventors have confirmed that an interval between adjacent ones of the plurality of wiring layers LM1 in the second direction Y is adjusted in the order of several hundreds of nanometers (the data ratio above is adjusted in the order of substantially 10%), allowing a decrease rate of the resistance value of the resistor layer LR to be adjusted in the order of substantially 0.2% within a range of substantially 1% (see FIG. 15). An increase rate of the resistance value of the resistor layer due to the micro-loading effect is substantially 0.2% or more and 0.6% or less. In other words, in the semiconductor device MCP1, a decrease rate of the resistance value of the resistor layer LR can easily be adjusted in such a manner as to offset the increase rate of the resistance value due to the micro-loading effect.

Also, in the semiconductor device MCP1, an adjustment accuracy of the decrease rate of the resistance value of each of the resistor layers LR does not depend on a magnitude of the width of each of the resistor layers LR in the first direction X and the interval between adjacent ones of the resistor layers LR in the first direction X. For example, it is relatively easy to adjust the date rate in the order of substantially 10%, even in a case in which the width of each of the resistor layers LR in the first direction X and the interval between adjacent ones of the resistor layers LR in the first direction X are set to be smaller than 100 nm. Whereas miniaturization of the resistor element has been developed, the semiconductor device MCP1 can also reduce a variation of the resistance value of the resistor element that has been further miniaturized.

Figure 16:
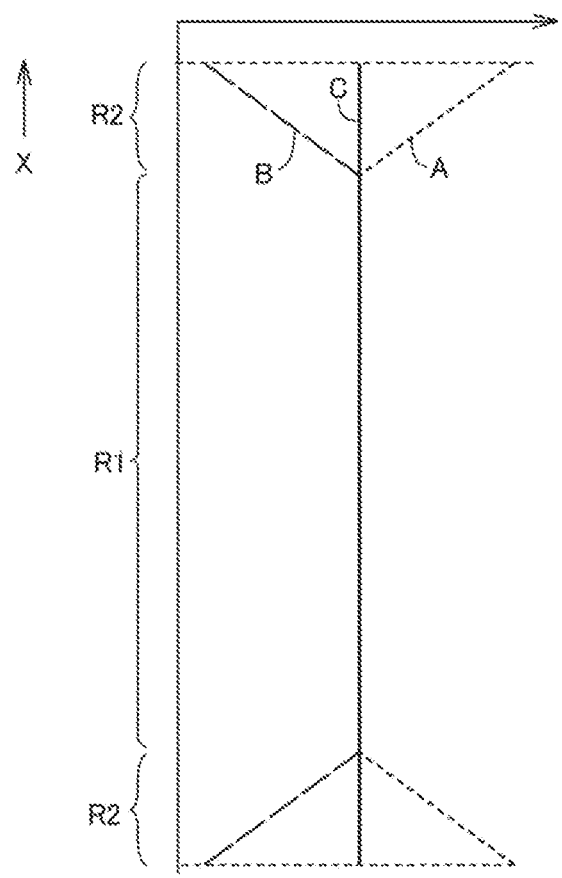
FIG. 16 is a diagram indicating a variation rate of a resistance value of a resistor layer in the semiconductor device according to the first embodiment.

Further, in the semiconductor device MCP1, each of the plurality of second resistor layers LR2 is disposed closer to the outside than each of the plurality of first resistor layers LR1, and the total value of the areas of the plurality of second overlapping regions of the second resistor layer LR2 that is located relatively closer to the outside in the first direction X is smaller than the total value of the areas of the plurality of second overlapping regions of the second resistor layer LR2 that is located relatively closer to the inner side in the first direction X. As a result, as indicated with a straight line C in FIG. 16, in the semiconductor device MCP1, a decreasing tendency B of the resistance value caused by the effect of buffering the stress applied to the resistor layer LR by the wiring layer LM1 can effectively offset an increasing tendency A of the resistance value due to the micro-loading effect.

In the semiconductor device MCP1, the wiring layer LM1 has the first wiring portion LM11, the second wiring portion LM12, the third wiring portion LM13, and the fourth wiring portion LM14. In the semiconductor device MCP1, the total value of the areas of each of the first overlapping region and the second overlapping region can be adjusted according to the length of each of the wiring portions in the first direction X and the interval between adjacent ones of the wiring portions in the second direction Y. Regarding the length of each of the wiring portions in the first direction X, it is only sufficient to adjust whether or not each of the wiring portions overlaps with each of the second resistor layers LR2, and accordingly, it is sufficient if the length of each of the wiring portions in the first direction X is adjusted in the order of several hundreds of nanometers that is substantially same as the interval between adjacent ones of the second resistor layers LR2 in the first direction X. In addition, as described above, in the semiconductor device MCP1, by adjusting the interval between adjacent ones of the wiring portions in the second direction Y in the order of several hundreds of nanometers, the resistance value of each of the resistor layers can be adjusted in the order of 0.1%. Hence, in the semiconductor device MCP1, a variation in resistance value of the resistor layer LR in each of the first region R1 and the second region R2 can relatively easily be reduced.

In the semiconductor device MCP1, the wiring layer LM1 is formed below the plurality of resistor layers LR. In this case, the wiring layer LM1 can be formed simultaneously as the lower wiring layer LM10 in the step of forming the lower wiring layer LM10. In other words, the semiconductor device MCP1 can be manufactured without accompanying an increase in the number of manufacturing steps, as compared with the conventional semiconductor device including the lower wiring layer.

Since the first resistor layer LR1 and the second resistor layer LR2 are each a thin film metal resistor, application of stress causes the resistance value of each of the first resistor layer LR1 and the second resistor layer LR2 to be decreased. A material included in each of the first resistor layer LR1 and the second resistor layer LR2 includes at least one selected from the group consisting of silicon chromium (SiCr), silicon chromium doped with carbon (SiCrC), nickel chromium (NiCr), titanium nitride (TiN), and tantalum nitride (TaN). The material above can relatively easily be processed.

According to the method of manufacturing the semiconductor device MCP1, it is possible to easily manufacture the semiconductor device MCP1 by adjusting the length of each of the wiring portion in the first direction Xs and the interval between adjacent ones of the wiring portions in the second direction Y in the order of several hundreds of nanometers.

Second Embodiment

Figure 17:
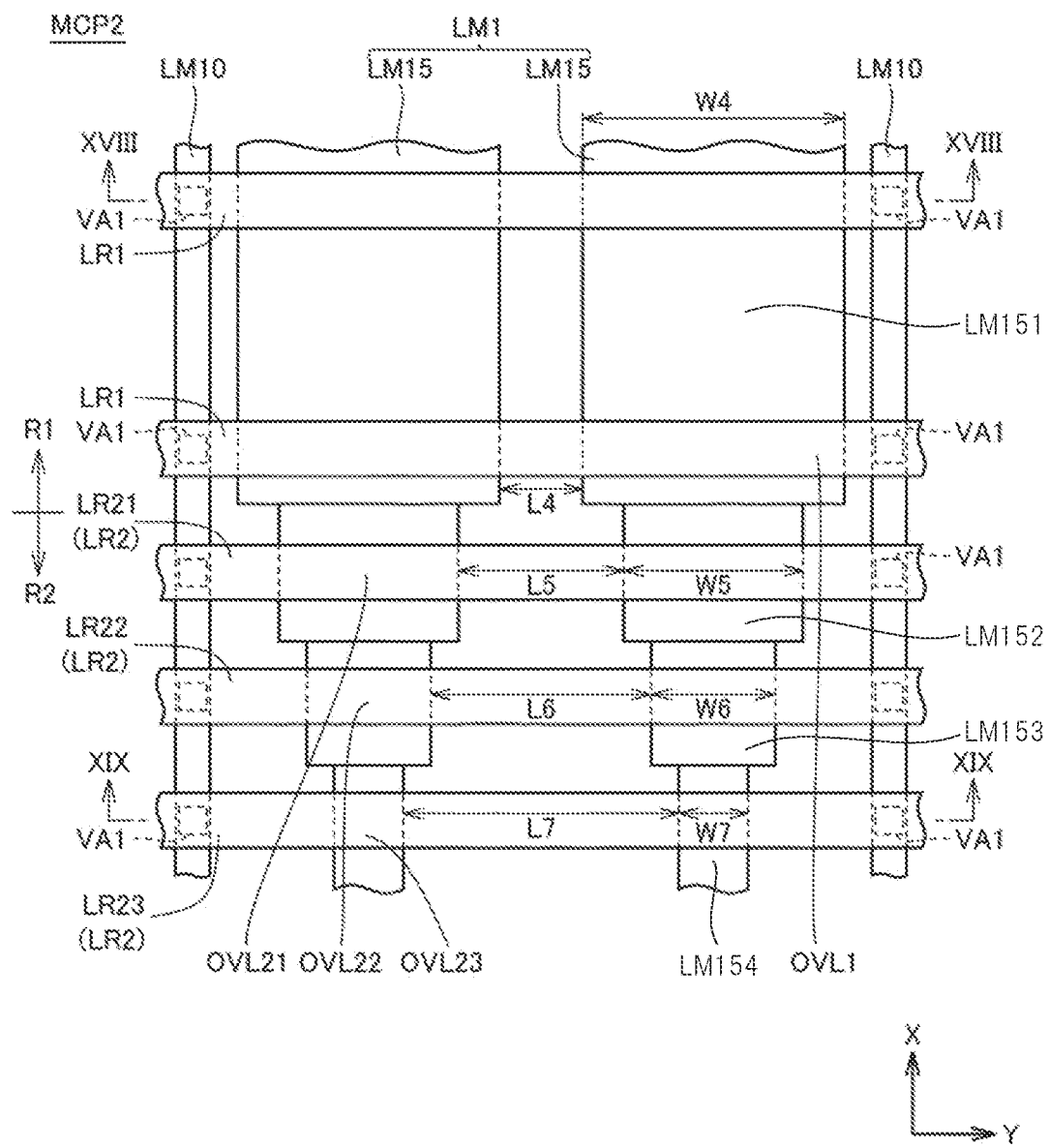
FIG. 17 is a plan view showing a plurality of resistor layers and a plurality of wiring layers of a semiconductor device according to a second embodiment.
Figure 18:
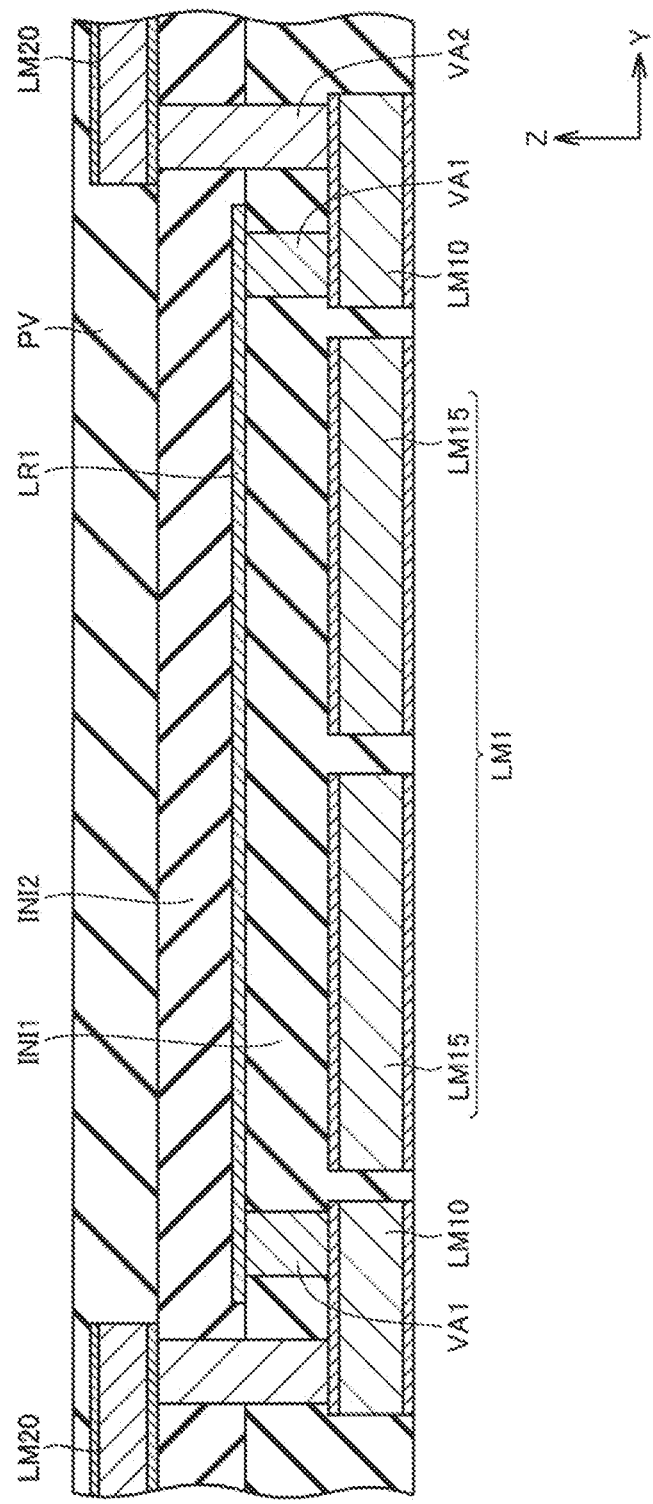
FIG. 18 is a cross-sectional view of the semiconductor device as viewed from an arrow XVIII-XVIII in FIG. 17.
Figure 19:
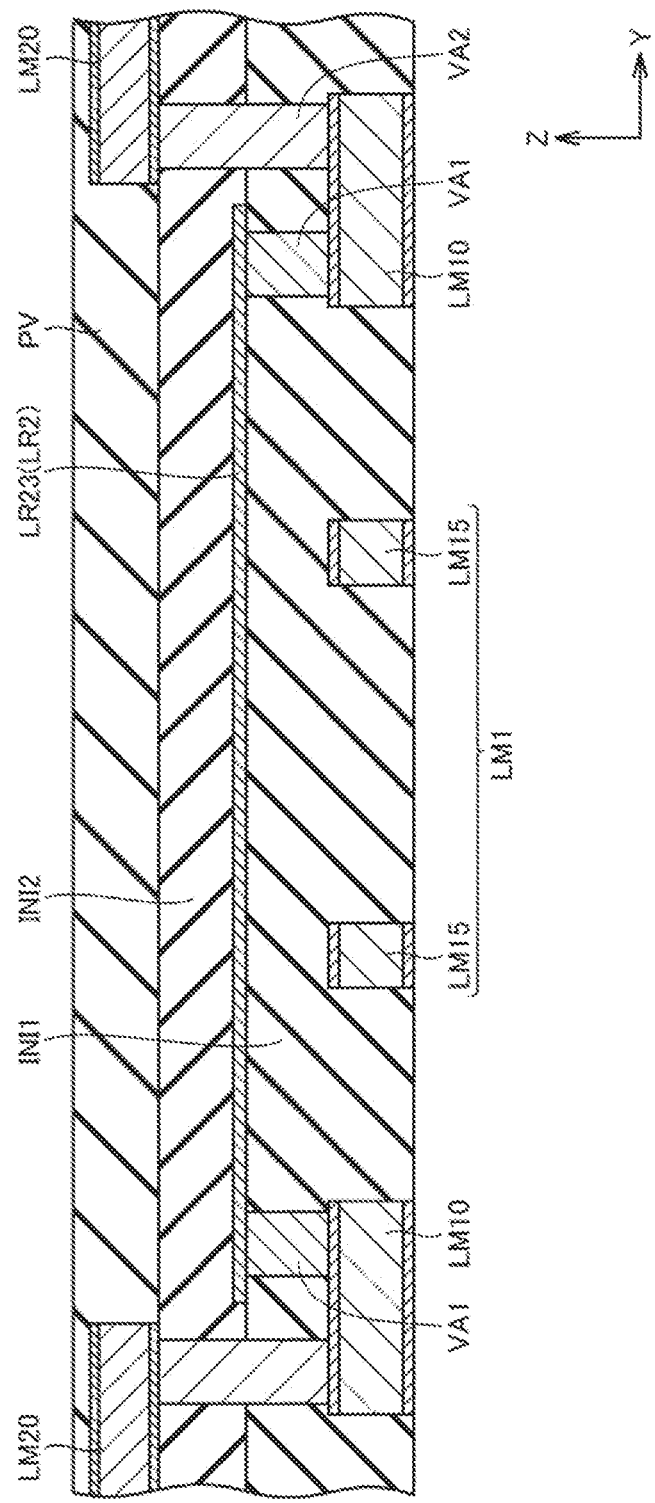
FIG. 19 is a cross-sectional view of the semiconductor device as viewed from an arrow XIX-XIX in FIG. 17.

As shown in FIG. 17 to FIG. 19, the semiconductor device MCP2 according to the second embodiment has basically the same configuration as that of the semiconductor device MCP1 according to the first embodiment, but the semiconductor device MCP2 according to the second embodiment is different from the semiconductor device MCP1 in that a width W4 of the first overlapping region OVL1 in the second direction Y is larger than a width W5 of the second overlapping region OVL21 in the second direction Y. In the following, differences between the semiconductor device MCP2 and the semiconductor device MCP1 will mainly be described. Note that, in FIG. 18 and FIG. 19, illustration of the semiconductor substrate SUB and the interlayer insulation layer INI0 is omitted.

The wiring layer LM1 includes, for example, a plurality of fifth wiring portions LM15. A width of the fifth wiring portion LM15 in the second direction Y becomes smaller in a stepwise manner as the fifth wiring portion LM15 is closer to the outside in the first direction X.

Each of the plurality of fifth wiring portions LM15 has, for example, a first part LM151, a second part M152, a third part LM153, and a fourth part LM154. The first part LM151 overlaps with each of the plurality of first resistor layers LR1, in plan view. The second part LM152 overlaps with the second resistor layer LR21, in plan view. The third part LM153 overlaps with the second resistor layer LR22, in plan view. The fourth part LM154 overlaps with the second resistor layer LR23, in plan view. In each of the plurality of fifth wiring portions LM15, a width of each of the first part LM151, the second part LM152, the third part LM153, and the fourth part LM154 in the second direction Y becomes narrower, in the order described above.

Each of the plurality of first resistor layers LR1 includes the first overlapping region OVL1 overlapping with the first part LM151 of each of the fifth wiring portions LM15, plan view. The second resistor layer LR21 includes the second overlapping region OVL21 overlapping with the second part LM152 of each of the fifth wiring portions LM15, in plan view. The second resistor layer LR22 includes the second overlapping region OVL22 overlapping with the third part LM153 of each of the fifth wiring portions LM15, in plan view. The second resistor layer LR23 includes the second overlapping region OVL23 overlapping with the fourth part LM154 of each of the fifth wiring portions LM15, in plan view.

The width W4 of each of the first overlapping regions OVL1 in the second direction Y is equal to a width of the first part LM151 of each of the plurality of fifth wiring portions LM15 in the second direction Y. The width W5 of each of the second overlapping regions OVL21 in the second direction Y is equal to a width of the second part LM152 of each of the plurality of fifth wiring portions LM15 in the second direction Y. A width W6 of each of the second overlapping regions OVL22 in the second direction Y is equal to a width of the third part LM153 of each of the plurality of fifth wiring portions LM15 the second direction Y. A width W7 of each of the second overlapping regions OVL23 in the second direction Y is equal to a width of the fourth part LM154 of each of the plurality of fifth wiring portions LM15 in the second direction Y.

An interval L5 between adjacent ones of the second overlapping regions OVL21 in the second direction Y is longer than an interval L4 between adjacent ones of the first overlapping regions OVL1 in the second direction Y. An interval L6 between adjacent ones of the second overlapping regions OVL22 in the second direction Y is longer than the interval L5 between adjacent ones of the second overlapping regions OVL21 in the second direction Y. An interval L7 between adjacent ones of the second overlapping regions OVL23 in the second direction Y is longer than the interval L6 between adjacent ones of the second overlapping regions OVL22 in the second direction Y.

The widths W4 of the first parts LM151 of the plurality of fifth wiring portions LM15 in the second direction Y are equal to each other, for example. The widths W5 of the second parts LM152 of the plurality of fifth wiring portions LM15 in the second direction Y are equal to each other, for example. The widths W6 of the third parts LM153 of the plurality of fifth wiring portions LM15 in the second direction Y are equal to each other, for example. The widths W7 of the fourth parts LM154 of the plurality of fifth wiring portions LM15 in the second direction Y are equal to each other, for example. Note that the respective widths of the first to the fourth parts LM151 to LM154 of the plurality of fifth wiring portions LM15 may be different from one another.

Also in the semiconductor device MCP2, a value obtained by dividing the total value of the respective areas of the plurality of second overlapping regions of each of the second resistor layers LR2 by the width of each of the second resistor layers LR2 in the first direction X is smaller than a value obtained by dividing the total value of the respective areas of the plurality of first overlapping regions OVL1 of each of the first resistor layers LR1 by the width of each of the first resistor layers LR1 in the first direction X. A value obtained by dividing the total value of the respective areas of the plurality of second overlapping regions of the second resistor layer LR2 that is located relatively closer to the outside in the first direction X by the width of each of the second resistor layers LR2 in the first direction X is smaller than a value obtained by dividing the total value of the respective areas of the plurality of second overlapping regions of the second resistor layer LR2 that is located relatively closer to the inner side in the first direction X by the width of each of the second resistor layers LR2 in the first direction X. A value obtained by dividing the total value of the respective areas of the plurality of second overlapping regions of the second resistor layer LR2 that is located on the outermost side in the first direction X by the width of the second resistor layer LR2 in the first direction X that is located on the outermost side in the first direction X is smallest in the values obtained by dividing the total values of the respective areas of the second overlapping regions of each of second resistor layers LR2 by the width of each of the second resistor layers LR2 in the first direction X.

Also in the semiconductor device MCP2, a ratio (data ratio) occupied by each of the plurality of second overlapping regions of each of the second resistor layers LR2 per unit area is smaller than a ratio occupied by each of the plurality of first overlapping regions OVL1 of each of the first resistor layers LR1 per unit area. A ratio occupied by each of the plurality of second overlapping regions of the second resistor layer LPL that is relatively closer to the outside in the first direction X per unit area is smaller than a ratio occupied by each of the plurality of second overlapping regions OVL2 of the second resistor layer LR2 that is relatively closer to the inner side in the first direction X per unit area. A ratio occupied by each of the second overlapping regions of the second resistor layer LR2 that is located on the outermost side in the first direction X per unit area is smallest in the ratios occupied by each of the second overlapping regions of each of the second resistor layers LR2 per unit area.

Accordingly, also in the semiconductor device MCP2, as in the semiconductor device MCP1, as the value obtained by dividing the total value of the areas of the overlapping regions of the resistor layer LR and wiring layer LM1 by the width of the resistor layer LR becomes smaller, the stress applied to the resistor layer LR becomes larger, and as a result, the resistance value of the resistor layer LR is likely to be decreased. More specifically, also in the semiconductor device MCP2, an effect similar to the semiconductor device MCP1 is attained.

Figure 20:
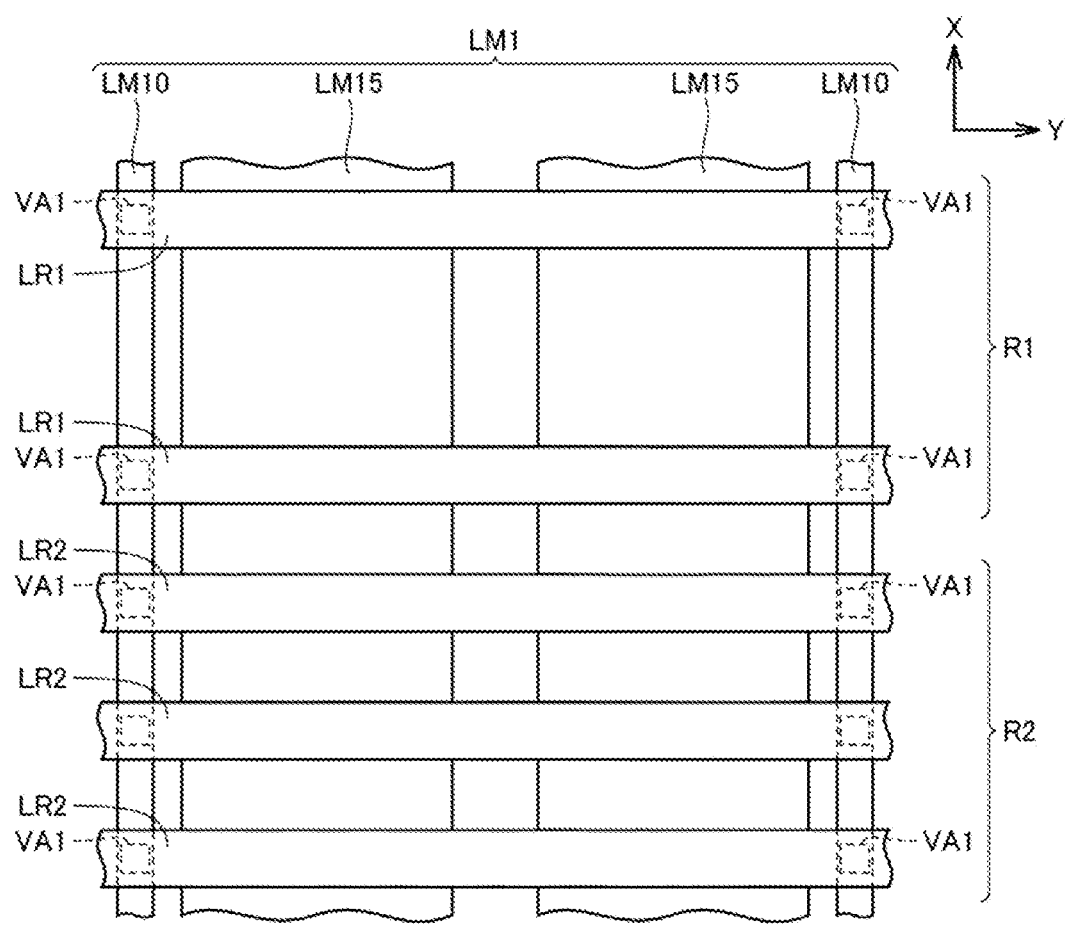
FIG. 20 is a plan view showing a plurality of resistor layers and a plurality of wiring layers of a semiconductor device according to a second comparative example.

For example, in the semiconductor device MCP2, without providing a dummy region that is not used for a circuit, a variation in resistance value of the resistor layer LR in each of the first region R1 and the second region R2 can further be reduced, as compared with a semiconductor device according to a second comparative example shown in FIG. 20.

In the semiconductor device according to the second comparative example shown in FIG. 20, as in the semiconductor device MCP2, the width of each of the second resistor layers LR2 in the first direction X is smaller than the width of each of the first resistor layers LR1 in the first direction X due to the micro-loading effect, and as a result, the total value of the respective areas of the plurality of second overlapping regions of each of the second resistor layers LR2 is smaller than the total value of the respective areas of the plurality of first overlapping regions OVL1 of each of the first resistor layers LR1. In contrast, the semiconductor device according to the second comparative example is different from the semiconductor device MCP2 in that a value obtained by dividing the total value of the respective areas of the plurality of second overlapping regions of each of the second resistor layers LR2 by the width of the second resistor layer LR2 in the first direction X is equal to a value obtained by dividing the total value of the respective areas of the plurality of first overlapping regions OVL1 of each of the first resistor layers LR1 by the width of the first resistor layer LR1 in the first direction X.

Also in the second comparative example, due to the micro-loading effect, a resistance value of the second resistor layer LR2 is higher than a resistance value of the first resistor layer LR1, and its increase rate is larger than 0.2%. Accordingly, the semiconductor device in which an allowable value of a variation rate of the resistance value of each resistor element falls within 0.2% needs to secure the number of resistor elements whose variation rate of the resistance value falls within 0.2% by making the first region wider and to set the second region R2 as a dummy region, thereby making it difficult to downsize plane dimensions of the semiconductor device.

In contrast, in the semiconductor device MCP2, as in the semiconductor device MCP1, the stress applied to the second resistor layer LR2 having the relatively small width is larger than the stress applied to the first resistor layer LR1 having the relatively large width. As a result, the decrease rate of the resistance value of the second resistor layer LR2 due to the stress becomes larger than the decrease rate of the resistance value of the first resistor layer LR1, and consequently, a variation in resistance value due to the difference in width in the first direction X between the first resistor layer LR1 and the second resistor layer LR2 can be reduced.

Moreover, in the semiconductor device MCP2, by adjusting the width of the wiring layer LM1 in the second direction Y, it is possible to adjust the resistance value of each resistor layer LR. Hence, also in the semiconductor device MCP2, the resistance value of each resistor layer LR can be adjusted with high accuracy.

The semiconductor device MCP2 can be manufactured by the same method as the semiconductor device MCP1.

Third Embodiment

Figure 21:
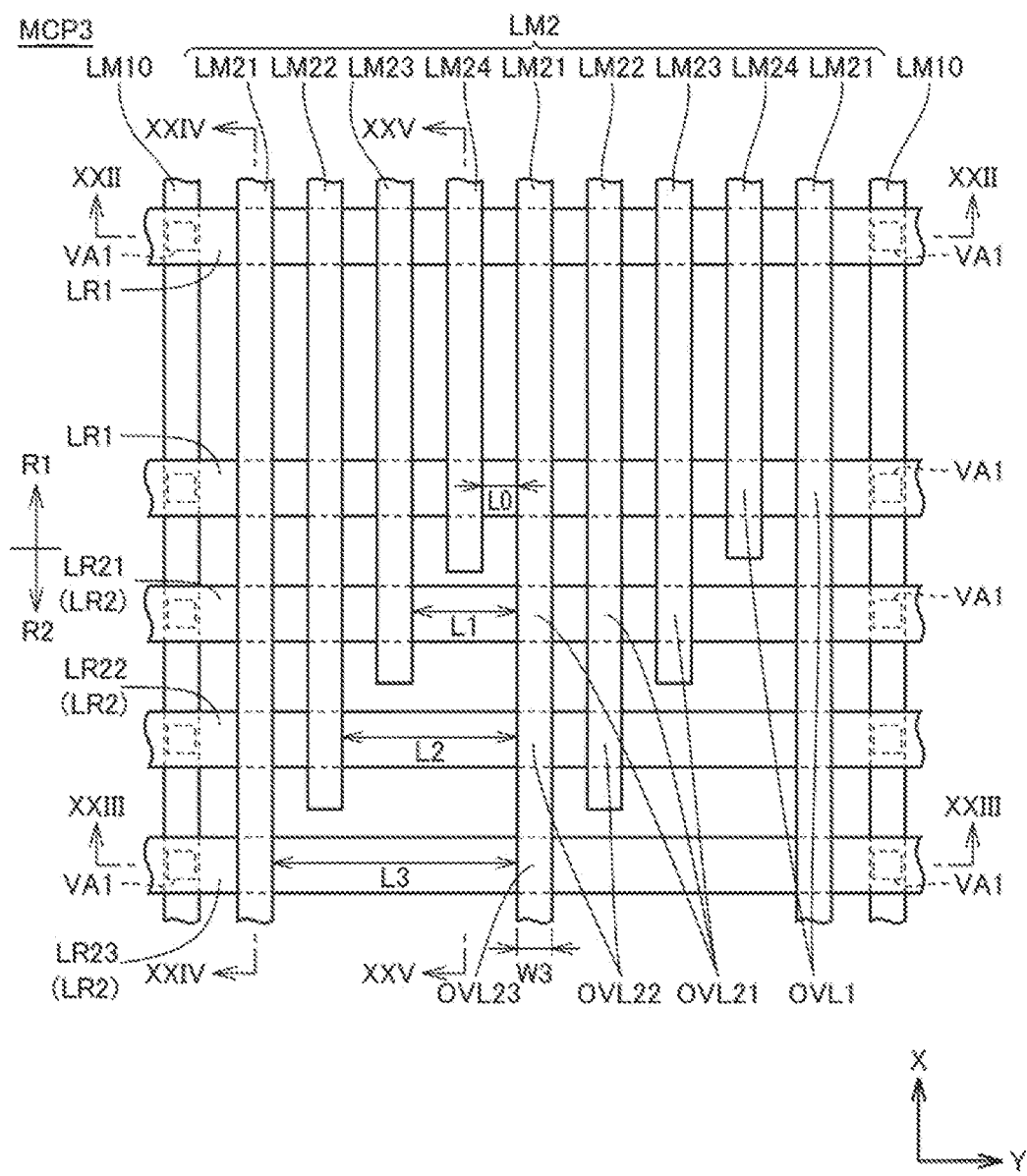
FIG. 21 is a plan view showing a plurality of resistor layers and a plurality of wiring layers of a semiconductor device according to a third embodiment.
Figure 22:
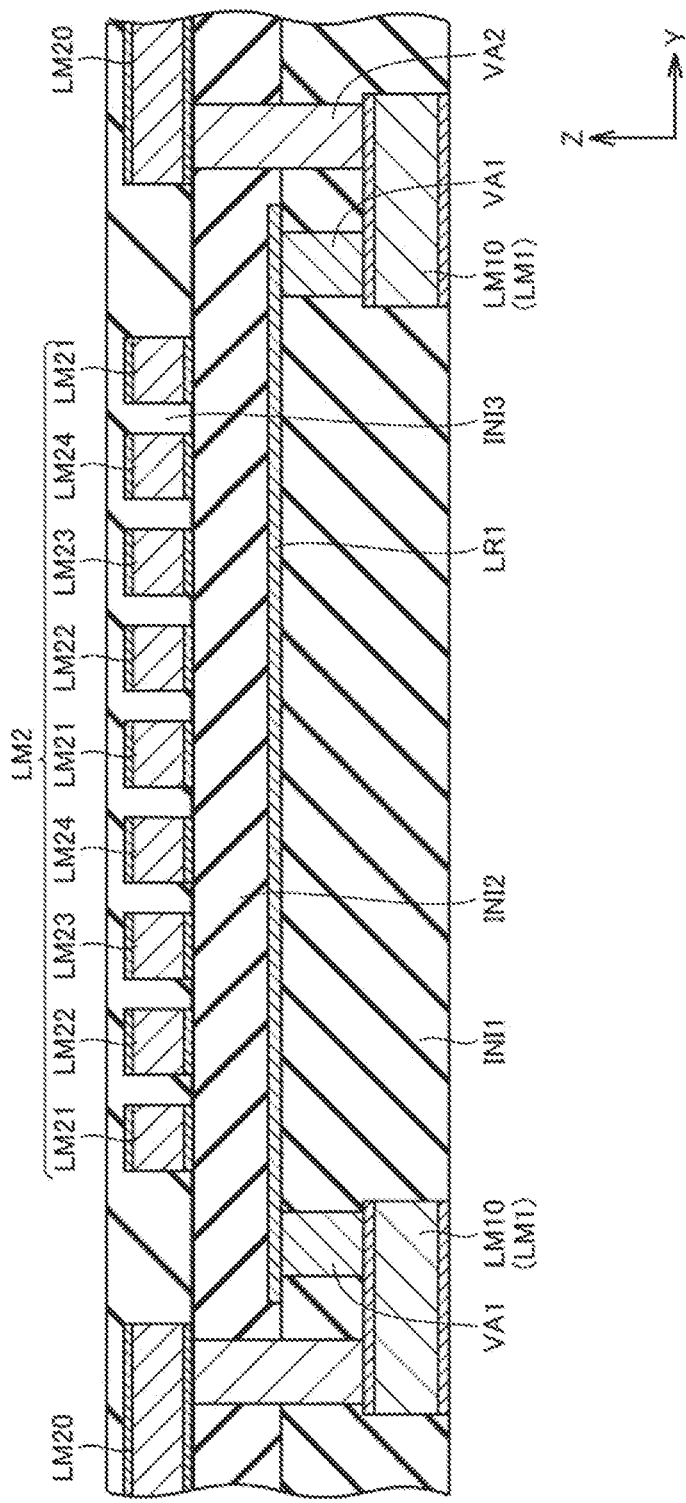
FIG. 22 is a cross-sectional view of the semiconductor device as viewed from an arrow XXII-XXII in FIG. 21.
Figure 23:
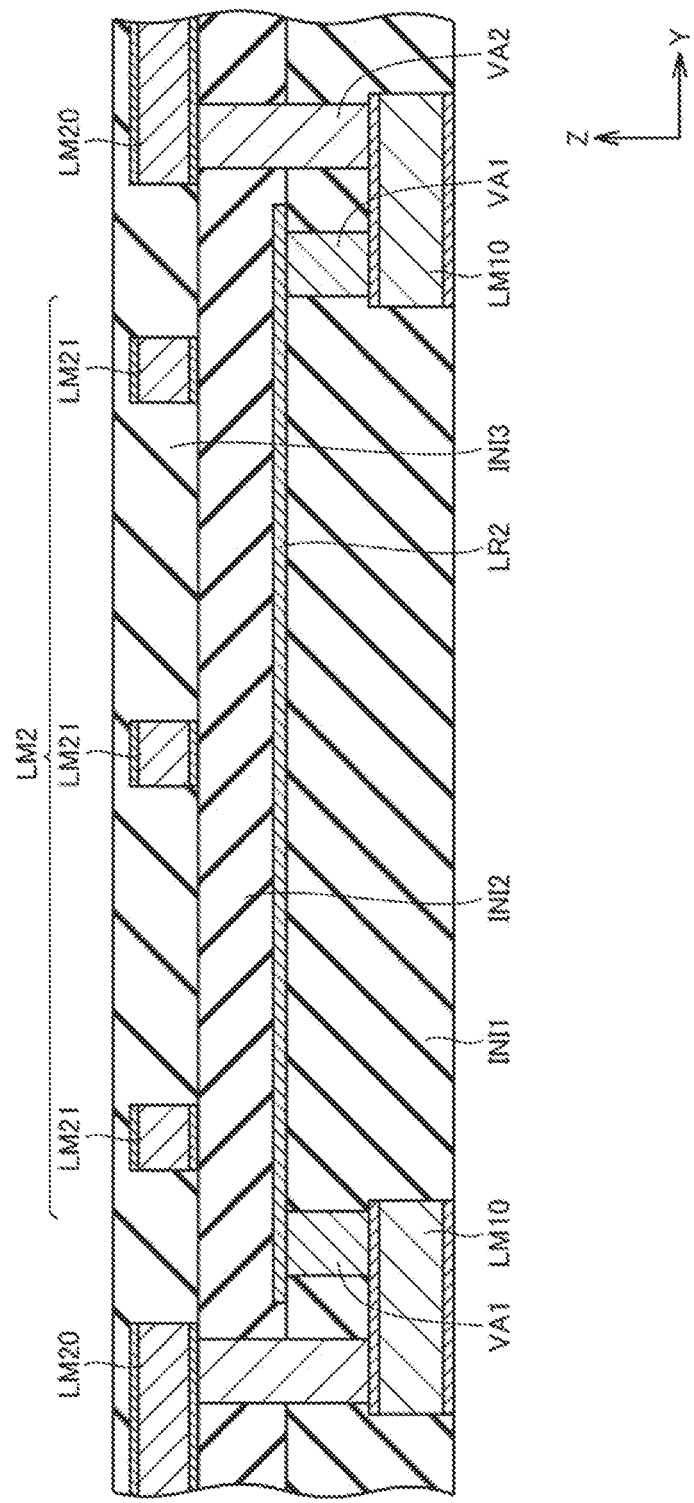
FIG. 23 is a cross-sectional view of the semiconductor device as viewed from an arrow XXIII-XXIII in FIG. 21.
Figure 24:
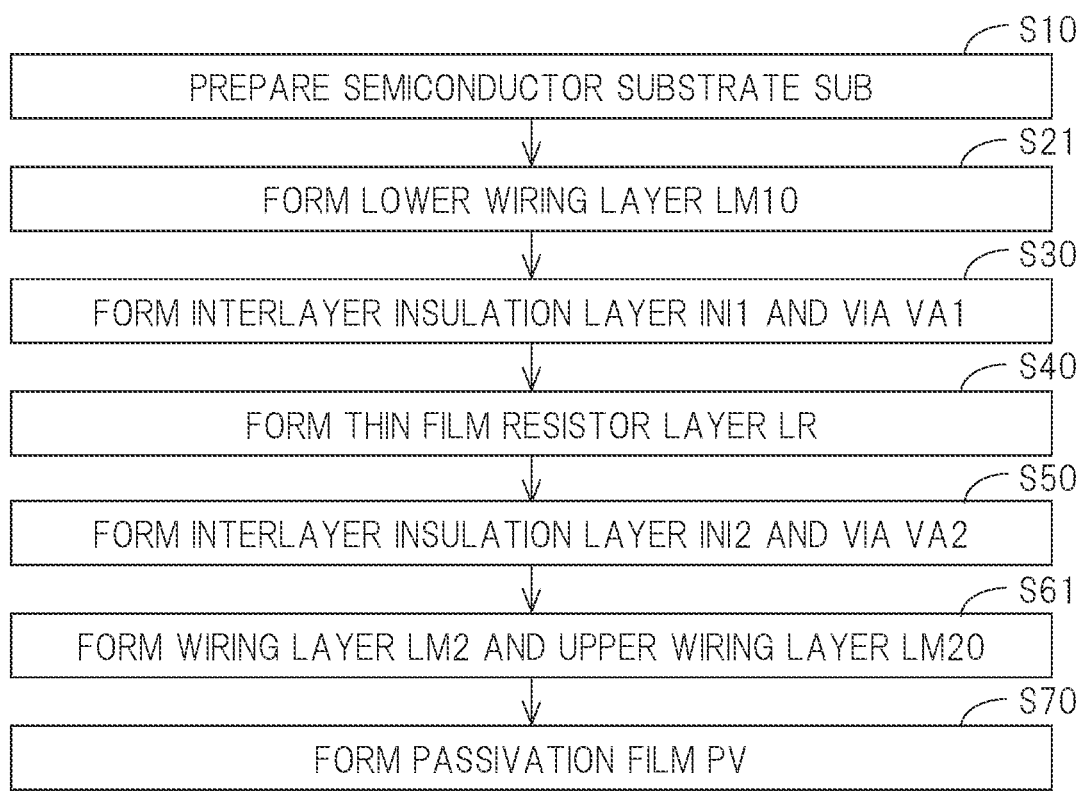
FIG. 24 is a flow chart of a method of manufacturing the semiconductor device according to the third embodiment.

As shown in FIG. 21 to FIG. 23, a semiconductor device MCP3 according to the third embodiment has basically the same configuration as that of the semiconductor device MCP1 according to the first embodiment, but the semiconductor device MCP3 according to the third embodiment is different from the semiconductor device MCP1 in that the semiconductor device MCP3 includes a wiring layer LM2 that is disposed above the plurality of resistor layers LR and that is provided so as to overlap with the plurality of resistor layers LR in plan view, in place of the wiring layer LM1. In the following, differences between the semiconductor device MCP3 and the semiconductor device MCP1 will mainly be described. Note that, in FIG. 22 and FIG. 24, illustration of the semiconductor substrate SUB and the interlayer insulation layer INI0 is omitted.

The wiring layer LM2 of the semiconductor device MCP3 has basically the same configuration as the wiring layer LM1 of the semiconductor device MCP1 and is different from the wiring layer LM1 in that the wiring layer LM2 is disposed above the plurality of resistor layers LR. The wiring layer LM2 includes a sixth wiring portion LM21, a seventh wiring portion LM22, an eighth wiring portion LM23, and a ninth wiring portion LM24 which have different lengths in the first direction X from each other.

The wiring layer LM2 is disposed in contact with the upper surface of the interlayer insulation layer INI2. The wiring layer LM2 is formed in the same layer as the upper wiring layer LM20, for example. From a different perspective, the wiring layer LM2 and the upper wiring layer LM20 are formed in the same step of the method of manufacturing the semiconductor device, and the heights thereof from the main surface (upper surface) of the semiconductor substrate SUB are equal to each other.

Also in the semiconductor device MCP3, as in the semiconductor device MCP1, as the value obtained by dividing the total value of the areas of the overlapping regions of the resistor layer LR and the wiring layers LM2 by the width of the resistor layer LR becomes smaller, the stress applied to the resistor layer LR becomes larger, the resistance value of the resistor layer LR is likely to be decreased. Specifically, also in the semiconductor device MCP3, the similar effect as the semiconductor device MCP1 is attained.

As shown in FIG. 24, the method of manufacturing the semiconductor device MCP3 is different from the method of manufacturing the semiconductor device MCP1 in that the method of manufacturing the semiconductor device MCP3 includes a step S21 of forming the lower wiring layer LM10, instead of the step S20 of forming the wiring layer LM1 and the lower wiring layer LM10 and that the method of manufacturing the semiconductor device MCP3 includes a step S61 of forming the wiring layer LM2 and the upper wiring layer LM20, instead of the step S60 of forming the upper wiring layer LM20. According to the method of manufacturing the semiconductor device MCP3, adjusting of a length of each wiring portion in the first direction X and an interval between adjacent ones of the wiring portions in the second direction Y in the order of several hundreds of nanometers makes it possible to manufacture the semiconductor device MCP3 easily.

Note that, except that the wiring layer LM2 disposed above the plurality of resistor layers LR is provided so as to overlap with the plurality of resistor layers LR in plan view, the semiconductor device MCP3 may include the same configuration as that of the semiconductor device MCP2.

Fourth Embodiment

Figure 25:
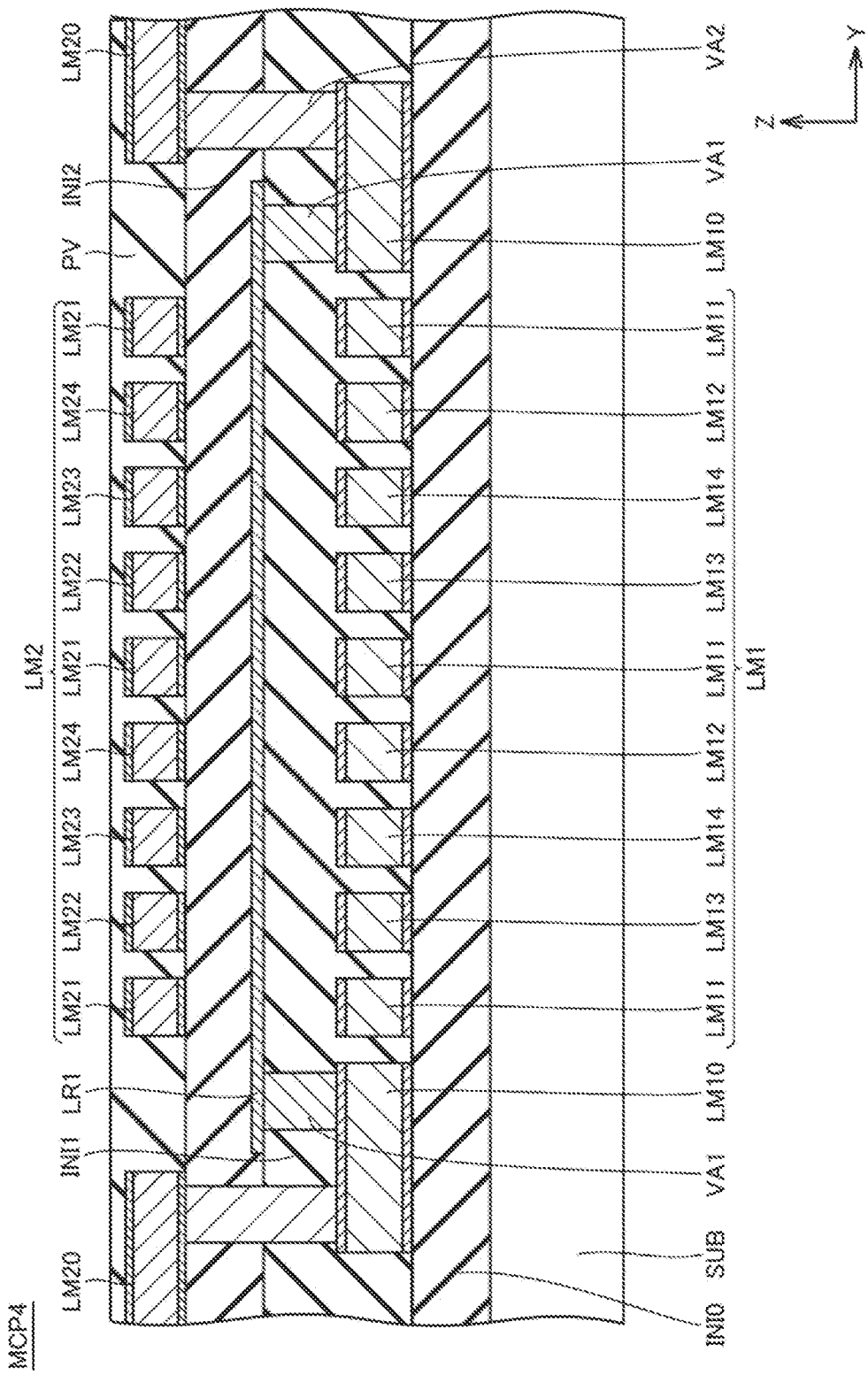
FIG. 25 is a plan view showing a plurality of resistor layers and a plurality of wiring layers of the semiconductor device according to a fourth embodiment.

As shown in FIG. 25, the semiconductor device MCP4 according to the fourth embodiment includes basically the same configuration as the semiconductor device MCP1 according to the first embodiment and is different from the semiconductor device MCP1 in that, in addition to the wiring layer LM1, the wiring layer LM2 that is disposed above the plurality of resistor layers LR and that is provided so as to overlap with the plurality of resistor layers LR in plan view is further provided.

The first overlapping region is a partial region of the first resistor layer LR1 overlapping with at least any of the wiring layer LM1 and the wiring layer LM2, in plan view. The second overlapping region is a partial region of the second resistor layer LR2 overlapping at least any of the wiring layer LM1 and the wiring layer LM2, in plan view.

Also in the semiconductor device MCP4, the value obtained by dividing the total value of the areas of the plurality of second overlapping regions of each of the second resistor layers LR2 by the width of the second resistor layer LR2 in the first direction X is smaller than the value obtained by dividing the total value of the areas of the plurality of first overlapping regions of each of the first resistor layers LR1 by the width of the first resistor layer LR1 in the first direction X. Also in the semiconductor device MCP4, the same effect as the semiconductor device MCP1 is attained.

Note that the semiconductor device MCP4 may include the same configuration as that of the semiconductor device MCP2, except that the wiring layer LM2 is further provided in addition to the wiring layer LM1.

MODIFICATION

In the semiconductor devices MCP1, MCP2, and MCP4, the plurality of second resistor layers LR2 may include one or more other second resistor layers LR2 outside the second resistor layer LR23. In this case, the wiring layer LM1 may further include one or more other wiring portions having a region overlapping with the other second resistor layers LR2, in plan view, in addition to the first wiring portion LM11, the second wiring portion LM12, the third wiring portion LM13, and the fourth wiring portion LM14.

In the semiconductor devices MCP1, MCP2, and MCP4, the number of wiring portion in the wiring layer LM1 is not particularly limited to any.

In the semiconductor devices MCP1, MCP2, and MCP4, the wiring layer LM1 continuously extends along the first direction X, but this is not limitative. At least part of the wiring layer LM1 may be formed intermittently in the first direction X. In this case, the wiring layer LM1 has a pair of ends that are disposed between two adjacent ones of the resistor layers LR in the first direction X, in plan view.

In the semiconductor devices MCP1 and MCP4, the wiring layer LM1 includes the first wiring portion LM11, the second wiring portion LM12, the third wiring portion LM13, and the fourth wiring portion LM14 which have different lengths in the first direction X from each other, but this is not limitative. Similarly, in the semiconductor devices MCP3 and MCP4, the wiring layer LM2 includes the sixth wiring portion LM21, the seventh wiring portion LM22, the eighth wiring portion LM23, and the ninth wiring portion LM24 which have different lengths in the first direction X from each other, but this is not limitative. Each of the wiring layer LM1 and the wiring layer LM2 may include at least two wiring portions which have different lengths in the first direction X from each other.

In the semiconductor devices MCP2, respective widths of the plurality of fifth wiring portions LM15 in the second direction Y may be different from each other.

In the foregoing, the invention made by the present inventors has been specifically described based on the embodiments, but it goes without saying that this invention is not limited to the embodiments described above and can variously be modified within the range not departing from the gist thereof.

What is claimed is:
1. A semiconductor device comprising:
an interlayer insulation layer;
a plurality of resistor layers which are each disposed in contact with an upper surface of the interlayer insulation layer and disposed spaced apart from each other in a first direction; and
a wiring layer which is disposed at least either above or below the plurality of resistor layers so as to overlap the plurality of resistor layers in plan view,
wherein the plurality of resistor layers include first resistor layers and second resistor layers, each of the second resistor layers having a width in the first direction smaller than a width of each of the first resistor layer in the first direction,
wherein the wiring layer includes:
a first lower wiring layer electrically connected with each of one end of the plurality of resistor layers;
a second lower wiring layer electrically connected with each of another end of the plurality of resistor layers; and
a first wiring portion and a second wiring portion which extend in parallel to each other, the first wiring portion and the second wiring portion being disposed between the first lower wiring layer and the second lower wiring layer in plan view,
wherein the first wiring portion overlaps with the first resistor layers and the second resistor layers in plan view,
wherein the second wiring portion overlaps with the first resistor layers in plan view and does not overlap with the second resistor layers in plan view,
wherein the first resistor layers include first overlapping regions which overlap with the wiring layer in plan view,
wherein the second resistor layers include second overlapping regions which overlap with the wiring layer in plan view, and
wherein a value obtained by dividing a total value of areas of the second overlapping regions by the width of each of the second resistor layers in the first direction is smaller than a value obtained by dividing a total value of areas of the first overlapping regions by the width of each of the first resistor layers in the first direction.

2. The semiconductor device according to claim 1, wherein the first resistor layers are disposed inside the second resistor layers in a region in which the plurality of resistor layers are disposed in plan view.

3. The semiconductor device according to claim 1, wherein a width of each of the first overlapping regions in a second direction orthogonal to the first direction is larger than a width of each of the second overlapping regions in the second direction.

4. The semiconductor device according to claim 1, wherein the wiring layer is formed below the plurality of resistor layers.

5. The semiconductor device according to claim 1, wherein the wiring layer is formed above the plurality of resistor layers.

6. The semiconductor device according to claim 1, wherein the wiring layer is disposed both above and below the plurality of resistor layers.

7. The semiconductor device according to claim 1, wherein each of the first resistor layers and the second resistor layers is made of a material containing a metal.

8. The semiconductor device according to claim 7, wherein the material included in each of the first resistor layers and the second resistor layers includes at least one selected from a group consisting of silicon chromium (SiCr), silicon chromium doped with carbon (SiCrC), nickel chromium (NiCr), titanium nitride (TiN), and tantalum nitride (TaN).

* * * * *